United States Patent
Chobot et al.

(10) Patent No.: US 10,161,612 B2
(45) Date of Patent: Dec. 25, 2018

(54) AMBIENT LIGHT MONITORING IN A LIGHTING FIXTURE

(71) Applicant: Cree, Inc., Durham, NC (US)

(72) Inventors: Joseph P. Chobot, Morrisville, NC (US); Daniel J. Pope, Morrisville, NC (US)

(73) Assignee: Cree, Inc., Durham, NC (US)

( * ) Notice: Subject to any disclaimer, the term of this patent is extended or adjusted under 35 U.S.C. 154(b) by 594 days.

(21) Appl. No.: 13/838,398

(22) Filed: Mar. 15, 2013

(65) Prior Publication Data

US 2014/0268790 A1    Sep. 18, 2014

(51) Int. Cl.
*F21S 8/00* (2006.01)
*F21V 23/04* (2006.01)
(Continued)

(52) U.S. Cl.
CPC ..... *F21V 23/0464* (2013.01); *H05B 37/0218* (2013.01); *H05B 37/0245* (2013.01); *F21S 2/00* (2013.01); *F21S 8/026* (2013.01); *F21Y 2101/00* (2013.01); *F21Y 2103/10* (2016.08); *F21Y 2113/13* (2016.08); *F21Y 2115/10* (2016.08); *H01L 2224/48091* (2013.01);
(Continued)

(58) Field of Classification Search
CPC ...... F21S 6/003; F21S 6/006; H05B 33/0854; H05B 33/0869; Y02B 20/46
USPC ...... 362/217.1–217.13, 276, 311.01, 311.02, 362/511; 315/154
See application file for complete search history.

(56) References Cited

U.S. PATENT DOCUMENTS

| | | |
|---|---|---|
| 3,557,380 A | 1/1971 | Matthews |
| 3,714,435 A | 1/1973 | Bestenreiner et al. |

(Continued)

FOREIGN PATENT DOCUMENTS

| | | | | |
|---|---|---|---|---|
| DE | 102010022477 | * 12/2011 | ......... | H05B 37/0218 |
| DE | 102010022477 A1 | 12/2011 | | |

(Continued)

OTHER PUBLICATIONS

English Machine Translation of DE102010022477.*
(Continued)

*Primary Examiner* — Zheng Song
(74) *Attorney, Agent, or Firm* — Withrow & Terranova, P.L.L.C.

(57) ABSTRACT

A lighting fixture employing a solid-state light source and an ambient light sensor is disclosed. The solid-state light source is placed within a light source housing and configured to emit light through a lens assembly that covers an opening into a mixing chamber provided within the light source housing. In one embodiment, the ambient light sensor is located within mixing chamber with the solid-state light source. In another embodiment, the ambient light sensor is located outside of the mixing chamber. In either embodiment, the ambient light sensor may be recessed within a waveguide, which aides in controlling the sensor distribution beam for the ambient light sensor. The sensor distribution beam essentially defines an area from which light reflected off of a task surface is accurately monitored via the ambient light sensor. The direction of the sensor distribution beam and the light emitted from the ambient light sensor may generally coincide.

16 Claims, 20 Drawing Sheets

(51) Int. Cl.
*H05B 37/02* (2006.01)
*F21Y 103/10* (2016.01)
*F21S 2/00* (2016.01)
*F21S 8/02* (2006.01)
*F21Y 101/00* (2016.01)
*F21Y 115/10* (2016.01)
*F21Y 113/13* (2016.01)

(52) U.S. Cl.
CPC ............... *H01L 2224/48247* (2013.01); *H01L 2224/73265* (2013.01); *H01L 2224/8592* (2013.01); *H01L 2924/181* (2013.01); *Y02B 20/46* (2013.01)

(56) References Cited

U.S. PATENT DOCUMENTS

| | | | |
|---|---|---|---|
| 4,023,034 A | 5/1977 | Schacht | |
| 5,701,058 A | 12/1997 | Roth | |
| 7,926,300 B2* | 4/2011 | Roberts et al. | 62/612 |
| 8,536,505 B2* | 9/2013 | Page | 250/205 |
| 8,648,550 B2 | 2/2014 | Staab | |
| 9,185,777 B2 | 11/2015 | Reed | |
| 9,832,831 B2 | 11/2017 | Birru et al. | |
| 2003/0185009 A1* | 10/2003 | Walters | F21V 23/0442 362/276 |
| 2004/0052076 A1 | 3/2004 | Mueller et al. | |
| 2004/0201835 A1 | 10/2004 | Coates et al. | |
| 2005/0277071 A1 | 12/2005 | Yee | |
| 2006/0007170 A1 | 1/2006 | Wilson et al. | |
| 2006/0091822 A1 | 5/2006 | Bierman et al. | |
| 2007/0185675 A1* | 8/2007 | Papamichael et al. | 702/85 |
| 2007/0194718 A1 | 8/2007 | Foo | |
| 2008/0121442 A1 | 5/2008 | Boer et al. | |
| 2008/0265799 A1 | 10/2008 | Sibert | |
| 2009/0141499 A1* | 6/2009 | Fabbri et al. | 362/276 |
| 2009/0212718 A1 | 8/2009 | Kawashima et al. | |
| 2009/0294671 A1 | 12/2009 | Baghai | |
| 2010/0045191 A1 | 2/2010 | Aendekerk | |
| 2010/0140634 A1 | 6/2010 | van de Ven et al. | |
| 2010/0171442 A1 | 7/2010 | Draper et al. | |
| 2010/0262297 A1 | 10/2010 | Shloush et al. | |
| 2010/0308737 A1 | 12/2010 | Hilgers | |
| 2011/0115386 A1 | 5/2011 | Delnoij | |
| 2011/0221350 A1 | 9/2011 | Staab | |
| 2011/0254554 A1 | 10/2011 | Harbers | |
| 2012/0098437 A1 | 4/2012 | Smed | |
| 2012/0176041 A1 | 7/2012 | Birru | |
| 2012/0268019 A1 | 10/2012 | Briggs | |
| 2012/0306377 A1 | 12/2012 | Igaki et al. | |
| 2013/0049598 A1* | 2/2013 | Nagashima et al. | 315/113 |
| 2013/0049606 A1 | 2/2013 | Ferstl et al. | |
| 2013/0107536 A1* | 5/2013 | Hiraoka et al. | 362/277 |
| 2013/0155392 A1 | 6/2013 | Barrilleaux et al. | |
| 2013/0234008 A1 | 9/2013 | Steiner | |
| 2013/0320862 A1 | 12/2013 | Campbell et al. | |
| 2013/0328486 A1 | 12/2013 | Jones | |
| 2014/0175985 A1* | 6/2014 | Billig et al. | 315/130 |
| 2014/0212090 A1 | 7/2014 | Wilcox et al. | |
| 2015/0022096 A1 | 1/2015 | Deixler | |

FOREIGN PATENT DOCUMENTS

| | | | | |
|---|---|---|---|---|
| EP | 1821581 A2 | | 8/2007 | |
| EP | 2594846 A1 | | 5/2013 | |
| JP | 2009289471 A | | 12/2009 | |
| JP | 2010073611 A | | 4/2010 | |
| JP | WO2012008262 | * | 1/2012 | ............... F21S 8/04 |
| JP | 2012059474 A | | 3/2012 | |
| KR | 20130121532 A | | 11/2013 | |
| WO | 2012008262 A1 | | 1/2012 | |
| WO | 2013027608 A1 | | 2/2013 | |
| WO | 2014120971 A1 | | 8/2014 | |
| WO | 2014170193 A1 | | 10/2014 | |

OTHER PUBLICATIONS

International Search Report and Written Opinion for PCT/US2014/023889, mailed Jun. 26, 2014, 22 pages.
Invitation to Pay Additional Fees and Partial Search for PCT/US2014/064305, mailed Feb. 11, 2015, 5 pages.
International Search Report and Written Opinion for PCT/US2014/064305, mailed Apr. 17, 2015, 16 pages.
International Preliminary Report on Patentability for PCT/US2014/023889, mailed Sep. 24, 2015, 17 pages.
Non-Final Office Action for U.S. Appl. No. 14/087,308, mailed Jul. 31, 2015, 36 pages.
Final Office Action for U.S. Appl. No. 14/087,308, mailed Feb. 12, 2016, 40 pages.
Notice of Allowance for U.S. Appl. No. 14/681,846, mailed Apr. 19, 2016, 7 pages.
Examination Report for European Patent Application No. 14715184.9, mailed Aug. 18, 2016, 5 pages.
International Preliminary Report on Patentability for PCT/US2014/064305, mailed Jun. 2, 2016, 11 pages.
International Search Report for International Patent Application No. PCT/US2016/024426, mailed Jun. 23, 2016, 11 pages.
Advisory Action for U.S. Appl. No. 14/087,308, mailed May 23, 2016, 3 pages.
Examination Report for European Patent Application No. 14715184.9, dated Feb. 2, 2017, 5 pages.
Non-Final Office Action for U.S. Appl. No. 14/087,308, dated Jan. 18, 2017, 43 pages.
Examination Report for European Patent Application No. 14715184.9, dated Aug. 18, 2017, 6 pages.
Examination Report for European Patent Application No. 14802765.9, dated Sep. 25, 2017, 5 pages.
Final Office Action for U.S. Appl. No. 14/087,308, dated Oct. 26, 2017, 49 pages.
Advisory Action for U.S. Appl. No. 14/087,308, dated Jan. 2, 2018, 3 pages.
International Preliminary Report on Patentability for International Patent Application No. PCT/US2016/024426, dated Oct. 19, 2017, 8 pages.
Examination Report for European Patent Application No. 16716353.4, dated Jul. 24, 2018, 4 pages.
Non-Final Office Action for U.S. Appl. No. 14/087,308, dated Jul. 18, 2018, 42 pages.
Decision to Grant for Japanese Patent Application No. 2017-553007, dated Sep. 7, 2018, 4 pages.

* cited by examiner

AMBIENT LIGHT MONITORING IN A LIGHTING FIXTURE

FIELD OF THE DISCLOSURE

The present disclosure relates to lighting fixtures, and in particular to monitoring ambient light with lighting fixtures and controlling the lighting fixtures accordingly.

BACKGROUND

In recent years, a movement has gained traction to replace incandescent light bulbs with lighting fixtures that employ more efficient lighting technologies as well as to replace relatively efficient fluorescent lighting fixtures with lighting technologies that produce a more pleasing, natural light. One such technology that shows tremendous promise employs solid-state lighting sources, such as light emitting diodes (LEDs). Compared with incandescent bulbs, LED-based light fixtures are much more efficient at converting electrical energy into light, are longer lasting, and are also capable of producing light that is very natural. Compared with fluorescent lighting, LED-based fixtures are also very efficient, but are capable of producing light that is much more natural and more capable of accurately rendering colors. As a result, lighting fixtures that employ LED technologies are expected to replace incandescent and fluorescent bulbs in residential, commercial, and industrial applications. As such, there is a continuing need for LED-based fixtures that can replace and at least match, and preferably exceed, the optical performance of incandescent and fluorescent bulbs.

In lighting environments that employ LED-based fixtures, there is a need to properly illuminate the environment, and in particular, the task surfaces on which tasks requiring light are performed. These task surfaces may include workbenches, desks, conference tables, playing surfaces, floors, walls, and the like. While lighting designers do their best to select the type, number, and placement of lighting fixtures for the environment, the amount of light illuminating the task surface may vary greatly based on the amount of ambient light that is present in the environment. For example, an environment with a lot of windows may have a lot of ambient sunlight during the day and little or no ambient light in the evening. There is a need for an efficient and effective way to compensate for the ambient light in a lighting environment.

SUMMARY

A lighting fixture employing a solid-state light source and an ambient light sensor is disclosed. The solid-state light source is placed within a light source housing and configured to emit light through a lens assembly that covers an opening into a mixing chamber provided within the light source housing. In one embodiment, the ambient light sensor is located within the mixing chamber with the solid-state light source. In another embodiment, the ambient light sensor is located outside of the mixing chamber. In either embodiment, the ambient light sensor may be recessed within a waveguide, which aids in controlling a sensor distribution beam for the ambient light sensor. The sensor distribution beam essentially defines an area from which light reflected off of a task surface is accurately monitored via the ambient light sensor. The direction of the sensor distribution beam and the light emitted from the solid-state light source may generally coincide.

The solid-state light source may include one or more LEDs, wherein the various LEDs may emit the same or different colors of light. For example, the solid-state light source may include an array of LEDs, wherein at least one LED is included that emits light at a first color and at least one other LED is included that emits at a second color that is different than the first color. The light from the LEDs is generally mixed to form light of a third color, such as white light, that has a desired intensity, color, color temperature, or the like.

A driver module may be coupled to the ambient light sensor and be configured to drive the solid-state light source. The driver module may monitor the output of the ambient light sensor and control the drive levels for the solid-state light source. The ambient light sensor output or information gleaned therefrom may be shared with other lighting fixtures or control entities via wired or wireless networking techniques.

For example, if the ambient light sensor is located outside of the mixing chamber, the driver module may read a first output from the ambient light sensor with the solid-state light source driven at a first level and then read a second output from the ambient light sensor with the solid-state light source driven at a second level. The driver module may then determine a setpoint based on a difference between the first output and the second output. The first and second drive levels need to be different, but may corresponding to on and off states, different dimming levels, or a combination thereof. Once the setpoint is determined, the driver module may monitor an output of the ambient light sensor and drive the solid-state light source such that the output of the ambient light sensor corresponds to the setpoint. As such, the driver module will use the ambient light sensor to ensure that the proper amount of light is added to the existing ambient light in the room to properly illuminate a desired task surface.

In another configuration, the ambient light sensor is located within the mixing chamber. In one embodiment, the driver module is configured to read an output of the ambient light sensor; determine a drive level for the solid-state light source based on the output; and drive the solid-state light source at the drive level to produce a desired light output. A look-up table or appropriate algorithm is provided to correlate the desired drive level based on the output of the ambient light sensor. Since the ambient light sensor is located within the mixing chamber, even if it is provided in a waveguide, the driver module may turn off the solid-state light source when the ambient light sensor output is being read.

Alternatively, the driver module may receive ambient light measurements from an associated lighting fixture, or information based thereon, and control the drive levels for the solid-state light source accordingly. In addition, the driver module may monitor the measurements of the associated ambient light sensor and provide these measurements, or information based thereon, to the associated lighting fixture.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
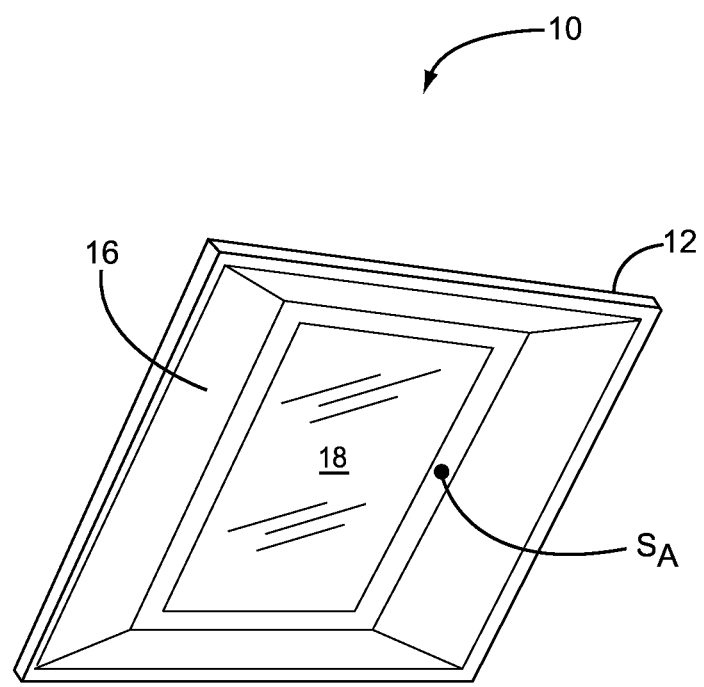
FIG. 1 is a perspective view of a troffer-based lighting fixture according to a first embodiment of the disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that relative terms such as "front," "forward," "rear," "below," "above," "upper," "lower," "horizontal," or "vertical" may be used herein to describe a relationship of one element, layer or region to another element, layer or region as illustrated in the figures. It will be understood that these terms are intended to encompass different orientations of the device in addition to the orientation depicted in the figures.

The present disclosure relates to lighting fixtures that can sense ambient light levels and control themselves accordingly. The ambient light in a space is generally defined as the level of light on a particular surface, which is referred to herein as a task surface TS. Typically, lighting designers will determine a desired light level for the one or more task surfaces TS in a space and develop a lighting plan that allocates and places a sufficient number of lighting fixtures to achieve the desired light levels on the task surfaces TS. Unfortunately, conditions in and surrounding the space significantly affect the light levels. For example, the color of the room or task surface TS, the presence or lack of sunlight through adjacent windows, the reflective nature of the task surface TS or items on the task surface TS, the presence of uncontemplated light sources, the number of people in the room, and the like, all influence the light levels on the task surface TS.

To address these issues, the present disclosure describes lighting fixtures that can accurately measure ambient light levels on a task surface TS and either control themselves or help control associated lighting fixtures in a network based on the ambient light levels to provide proper light levels on task surfaces TS. Such lighting fixtures can be implemented in various configurations, such as a troffer-type lighting fixture, recessed lighting fixture, can lights (or downlights), surface mount lighting fixtures, suspended lighting fixtures, and the like. For purposes of illustration only, the concepts of this disclosure will be primarily described in the context of a troffer-type lighting fixture. In general, troffer-type lighting fixtures are designed to mount in a ceiling, such as a drop ceiling of a commercial, educational, or governmental facility. Before delving into the details of ambient light sensing, an overview of exemplary lighting fixture configurations having integrated ambient light sensors is provided.

Figure 2:
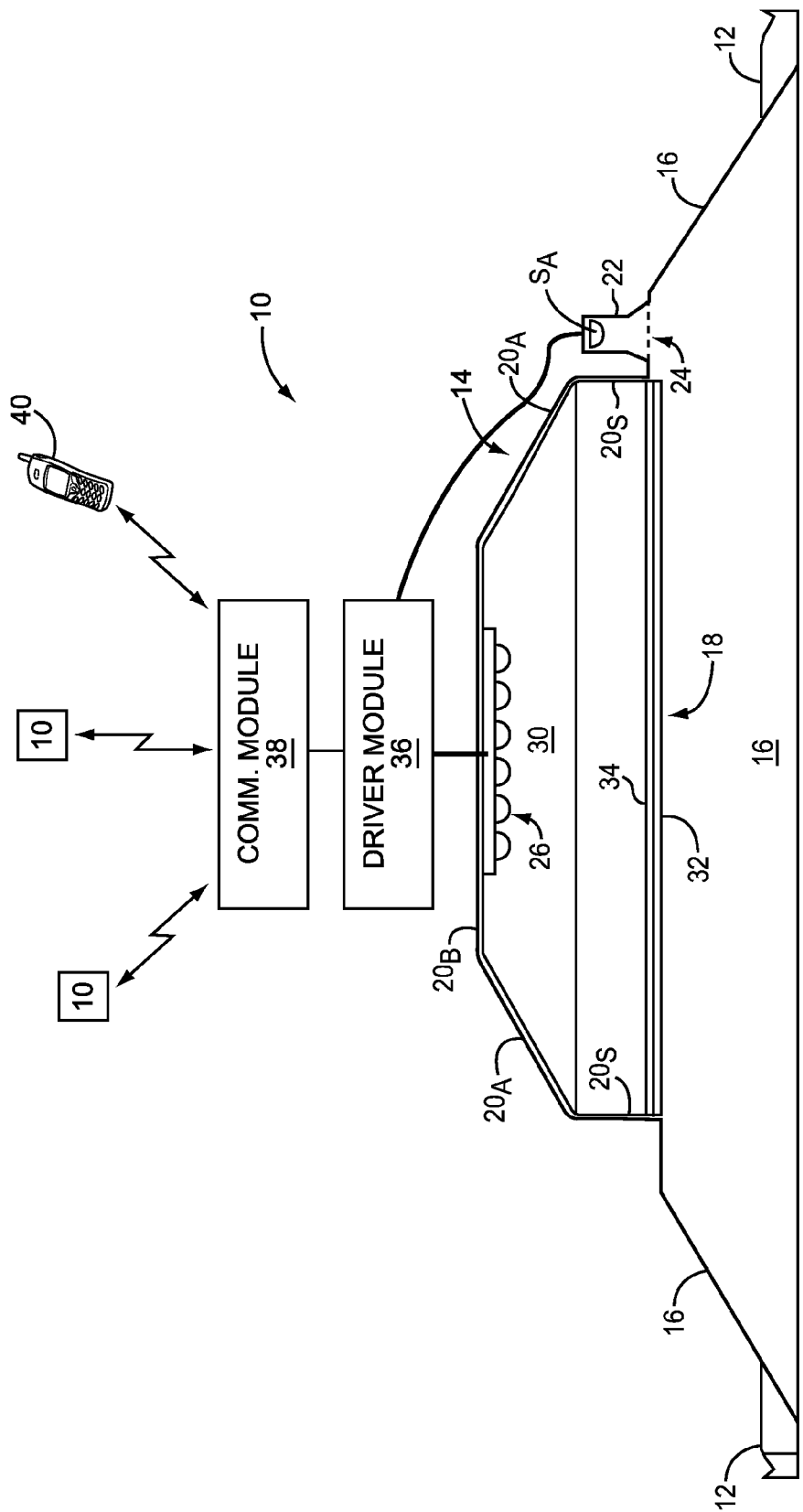
FIG. 2 is a cross-section of the lighting fixture of FIG. 1.
Figure 3:
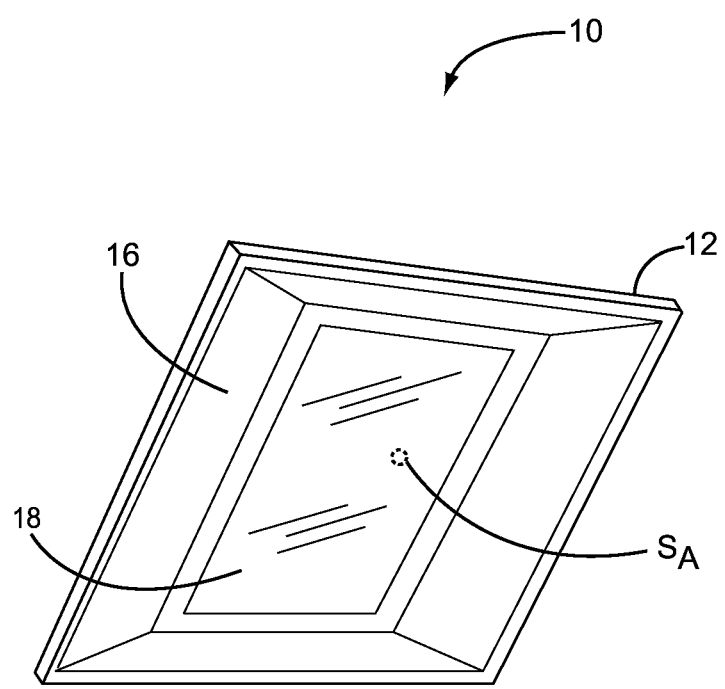
FIG. 3 is a perspective view of a troffer-based lighting fixture according to a second embodiment of the disclosure.

In FIGS. 1 and 2, an exemplary troffer-type lighting fixture 10 is shown in isometric and cross-section views, respectively. The primary structure of the lighting fixture 10 includes a frame 12, a light source housing 14, and reflectors 16 that extend between an outer portion of the frame 12 and a bottom opening in the light source housing 14. A lens assembly 18 is provided over the opening of the light source housing 14.

With particular reference to FIG. 2, the illustrated light source housing 14 is formed from side walls 20S, angled walls 20A, and a back wall 20B. At least the interior surface of the side walls 20S, the angled walls 20A, and the back wall 20B have reflective surfaces. Alternatively, an interior reflector structure may be provided inside the light source housing 14. The side walls 20S extend rearward from the inside of the reflectors 16, and the angled walls 20A extend between the side walls 20S and the outer periphery of the back wall 20B. While it is not necessary to practice the concepts disclosed herein, the back wall 20B is illustrated as being substantially perpendicular to the side walls 20S, and the angled walls 20A form an acute angle that is less than 90° relative to the plane in which the lens assembly 18 lies. The lens assembly 18 is shown as being planar and substantially parallel to the back wall 20B; however, virtually any shape or configuration may be provided for the lens assembly 18.

For this embodiment, an ambient light sensor $S_A$ is provided outside of the light source housing 14 and recessed in the back of a waveguide 22, which has an opening 24 that resides in substantially the same plane as the lens assembly 18. The ambient light sensor $S_A$ is also electrically coupled to a driver module 36. Recessing the ambient light sensor $S_A$ in the back of the waveguide 22 helps prevent, or at least reduce the amount of, light that is not reflected off of the task surface TS from reaching the ambient light sensor $S_A$. The ambient light sensor $S_A$ may be configured to detect a broad band of visible light or be configured to receive or filter out select bands of the visible and invisible light spectrum. For example, if the total amount of ambient light, including sunlight, should be detected, an ambient light sensor $S_A$ capable of detecting a broad range of light may be used. If sunlight and infrared light should not enter into the equation, the ambient light sensor $S_A$ may be provided with a special coating that filters out red light in the visible and infrared spectrum. Details related to measuring ambient light levels and controlling the lighting fixture 10 based on the light levels are provided further below.

The back wall 20B of the light source housing 14 provides a mounting structure for the LED array 26, which includes a mounting substrate, such as a printed circuit board (PCB), and a number of LEDs. The LEDs of the LED array 26 are oriented to generally emit light downward toward the lens assembly 18. The cavity bounded by the lens assembly 18 and the interior of the light source housing 14 provides a mixing chamber 30. Notably, the ambient light sensor $S_A$ is mounted outside of the mixing chamber 30 in this embodiment, such that little or no light that exits the lens assembly 18 passes directly into the waveguide 22 via the opening 24. Light from the LED array 26 of the lighting fixture 10, other light sources, and the like that is reflected off of the task surface TS may enter the waveguide 22 and be sensed by the ambient light sensor $S_A$. Again, details related to measuring ambient light levels and control based thereon are provided further below.

Figure 4:
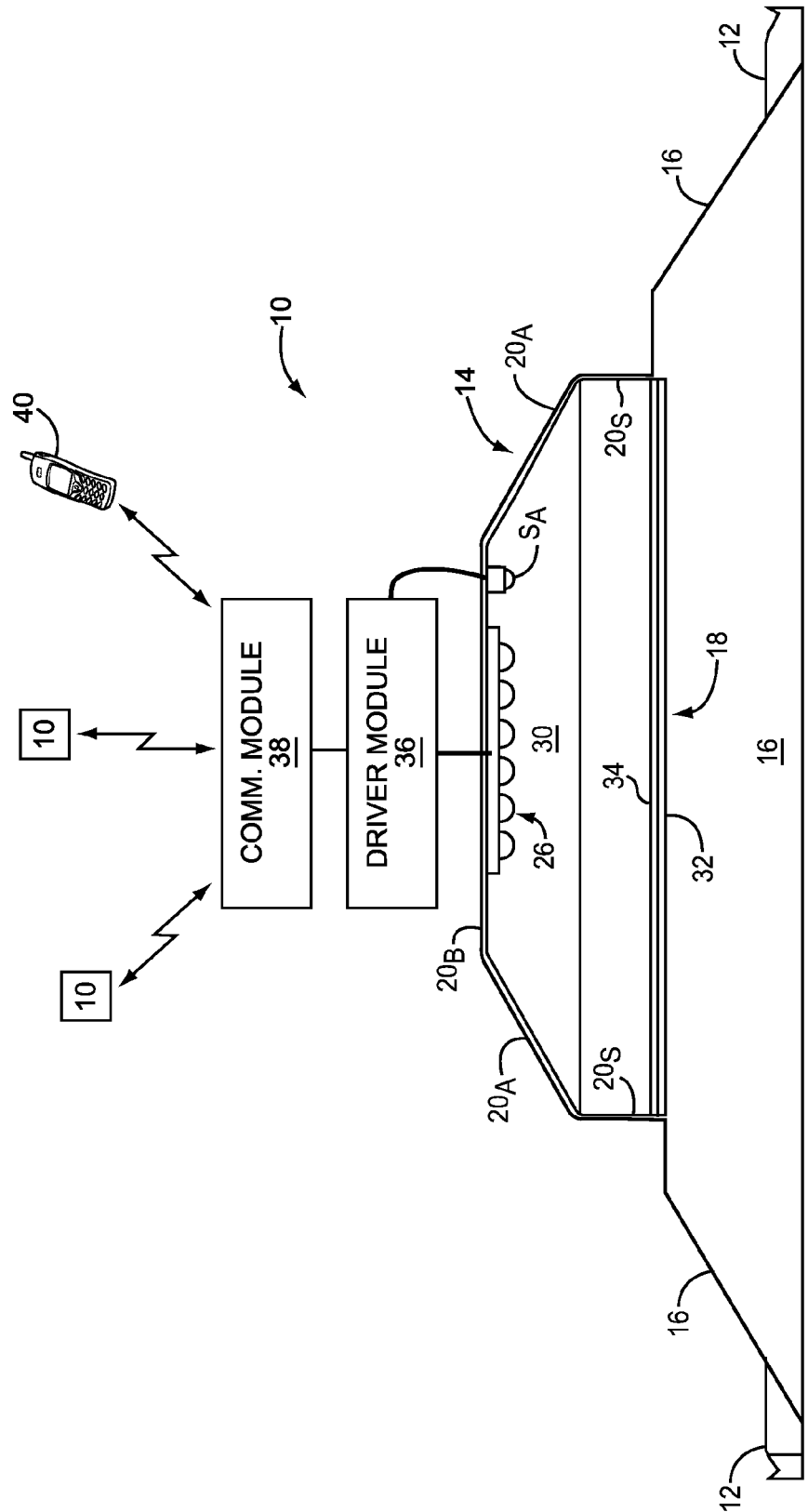
FIG. 4 is a cross-section of the lighting fixture of FIG. 3 according to a first embodiment.
Figure 5:
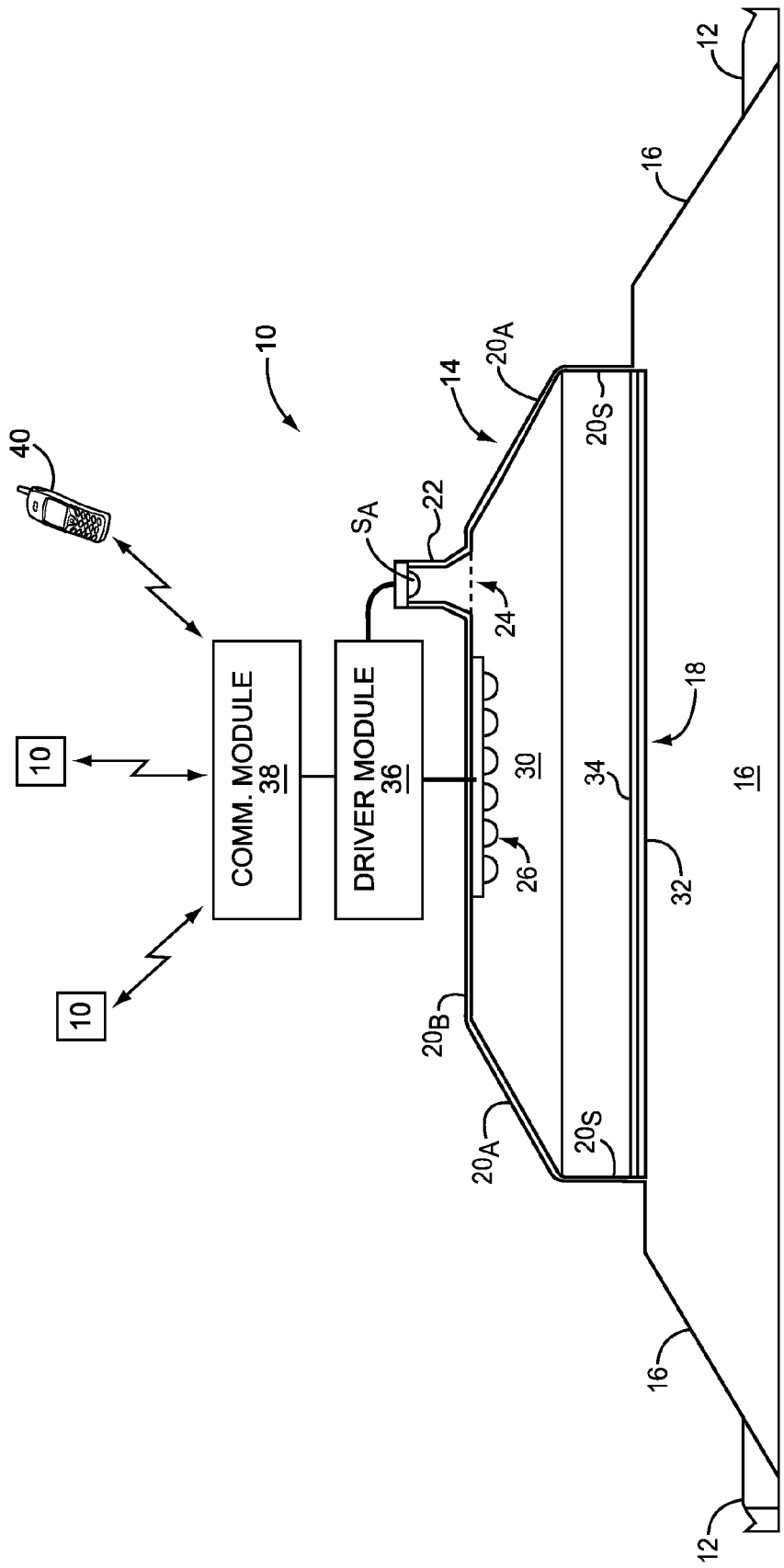
FIG. 5 is a cross-section of the lighting fixture of FIG. 3 according to a second embodiment.

In contrast with the embodiment of FIGS. 1 and 2, FIGS. 3 and 4 illustrate an embodiment wherein the ambient light sensor $S_A$ is located within the mixing chamber 30. The ambient light sensor $S_A$ is considered to be within the mixing chamber 30 if the opening 24 of the waveguide 22 extends to or into the mixing chamber 30. As shown in FIG. 4, the ambient light sensor $S_A$ is mounted on the back wall 20B of the light source housing 14 along with the LED array 26, and is not recessed within a waveguide 22. FIG. 5 illustrates another embodiment where the ambient light sensor $S_A$ is mounted within the mixing chamber 30 and recessed within a waveguide 22. As illustrated, the opening 24 of the waveguide 22 is provided on the back wall 20B of the light source housing 14. The waveguide 22 is substantially perpendicular to the back wall 20B. When the ambient light sensor $S_A$ is provided in the mixing chamber 30, the LED array 26 may need to be turned off to achieve an accurate measurement of ambient light, because the light in the mixing chamber 30 when the LED array 26 is on may saturate the ambient light sensor $S_A$. When the ambient light sensor $S_A$ is appropriately configured and mounted outside of the mixing chamber 30, as provided in FIGS. 1 and 2, ambient light measurements may be taken when the LED array 26 is on.

The lens assembly 18 for any of the above embodiments may include a relatively clear lens 32 and a diffuser 34. The degree and type of diffusion provided by the diffuser 34 may vary from one embodiment to another. Further, color, translucency, or opaqueness of the diffuser 34 may vary from one embodiment to another. Diffusers 34, such as that illustrated in FIG. 2, are typically formed from a polymer or glass, but other materials are viable and will be appreciated by those skilled in the art. Similarly, the lens 32 generally corresponds to the shape and size of the diffuser 34 as well as the front opening of the light source housing 14. As with the diffuser 34, the material, color, translucency, or opaqueness of the lens 32 may vary from one embodiment to another. Further, both the diffuser 34 and the lens 32 may be formed from one or more materials or one or more layers of the same or different materials. While only one diffuser 34 and one lens 32 are depicted, the lighting fixture 10 may have multiple diffusers 34 or lenses 32.

Light emitted from the LED array 26 is mixed inside the mixing chamber 30 and directed out through the lens assembly 18. The LED array 26 may include LEDs that emit different colors of light, as described further below. For example, the LED array 26 may include both red LEDs that emit red light and blue-shifted yellow (BSY) LEDs that emit bluish-yellow light, wherein the red and bluish-yellow light is mixed to form "white" light at a desired color temperature. For a uniformly colored light output, relatively thorough mixing of the light emitted from the LED array 26 is desired. Both the reflective interior surfaces of the light source housing 14 and the diffusion provided by the diffuser 34 play a significant role in mixing the light emanated from the LED array 26.

In particular, certain light rays, which are referred to as non-reflected light rays, emanate from the LED array 26 and exit the mixing chamber 30 through the diffuser 34 and lens 32 without being reflected off of the interior surfaces of the light source housing 14. Other light rays, which are referred to as reflected light rays, emanate from the LED array 26 and are reflected off of the reflective interior surfaces of the light source housing 14 one or more times before exiting the mixing chamber 30 through the diffuser 34 and lens 32. With these reflections, the reflected light rays are effectively mixed with each other and at least some of the non-reflected light rays within the mixing chamber 30 before exiting the mixing chamber 30 through the diffuser 34 and the lens 32.

As noted above, the diffuser 34 functions to diffuse, and as a result mix, the non-reflected and reflected light rays as they exit the mixing chamber 30, wherein the mixing chamber and the diffuser 34 provide the desired mixing of the light emanated from the LED arrays 26 to provide a light output of a consistent color, color temperature, or the like. In addition to mixing light rays, the lens 32 and diffuser 34 may be configured and the interior of the light source housing 14 and reflectors 16 shaped in a manner to control the relative distribution and shape of the resulting light beam, and thus the distribution of light, that is projected from the lighting fixture 10. For example, a first lighting fixture 10 may be designed to provide a concentrated light output for a spotlight, wherein another may be designed to provide a widely dispersed light output. From an aesthetics perspective, the diffusion provided by the diffuser 34 also prevents the emitted light from looking pixelated, and obstructs the ability for a user to see the individual LEDs of the LED array 26.

As provided in the above embodiment, the more traditional approach to diffusion is to provide a diffuser 34 that is separate from the lens 32. As such, the lens 32 is effectively transparent and does not add any intentional diffusion. The diffuser 34 provides the intentional diffusion. As a first alternative, the diffuser 34 may take the form of a film that is directly applied to one or both surfaces of the lens 32. Such film is considered a "volumetric" film, wherein light diffusion occurs within the body of the diffusion film. One exemplary diffusion film is the ADF 3030 film provided by Fusion Optix, Inc. of 19 Wheeling Avenue, Woburn Mass. 01801, USA. As a second alternative, the lens assembly 18 may be configured as a composite lens, which provides the functionality of both the lens 32 and the diffuser 34. Such a composite lens may be a volumetric lens, which means the light passing through the composite lens is diffused in the body of the composite lens. The composite lens referenced above could be made of a diffusion grade acrylic or a polycarbonate material such as Bayer Makrolon® FR7087, Makrolon® FR7067, with 0.5% to 2% diffusion doping or Sabic EXRL0747-WH8F013X, EXRL0706-WHTE317X, LUX9612-WH8E490X and LUX9612-WH8E508X. The WHxxxxxx defines the degree of diffusion.

The electronics used to drive the LED array 26 are shown provided in a single driver module 36; however, the electronics may be provided in different modules. Further, these electronics may be provided with wired or wireless communications ability, as represented by the illustrated communications module 38. At a high level, the driver module 36 is coupled to the LED array 26 through cabling and directly drives the LEDs of the LED array 26 based on one or a combination of internal logic; inputs received from another device, such as a switch or sensor; or control information provided by the communications module 38. In the illustrated embodiment, the driver module 36 provides the primary intelligence for the lighting fixture 10 and is capable of driving the LEDs of the LED array 26 in a desired fashion. Notably, primary intelligence of the lighting fixture may reside in the communications module 38 in select embodiments.

The communications module 38 may act as a communication interface that facilitates communications between the driver module 36 and other lighting fixtures 10, sensors (not shown), switches (not shown), a remote control system (not shown), or a portable handheld commissioning tool 40, which may also be configured to communicate with a remote control system in a wired or wireless fashion. The commissioning tool 40 may be used for a variety of functions, including the commissioning of a lighting network or modifying the operation, configurations, settings, firmware, or software of the driver module 36 and the communications module 38. Details of an exemplary configuration that employs a driver module 36 and a communications module 38 are provided further below.

Figure 6:
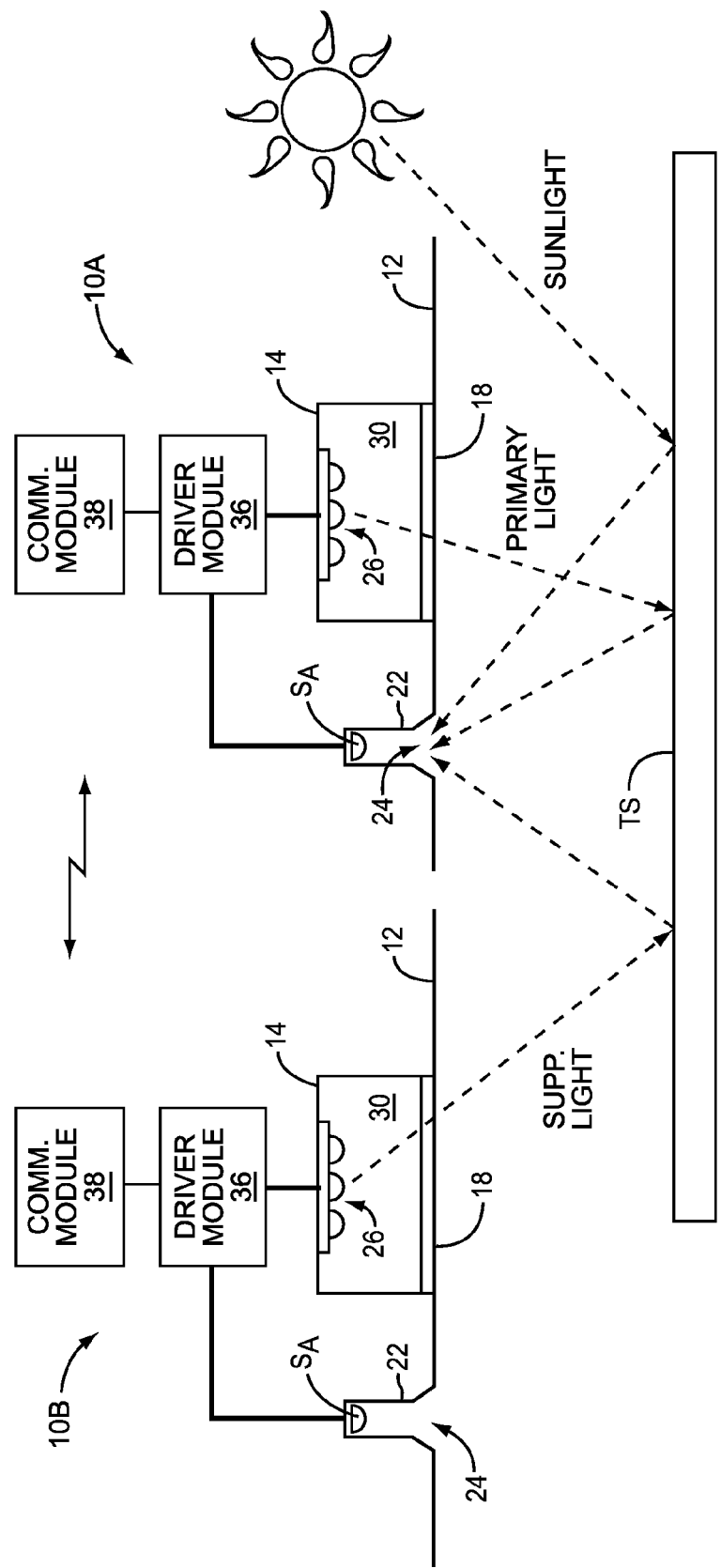
FIG. 6 illustrates a lighting environment with lighting fixtures such as those provided in FIGS. 1 and 2.

With reference to FIG. 6, a lighting environment is illustrated with two lighting fixtures 10. The two lighting fixtures 10 are individually referenced as lighting fixture 10A and lighting fixture 10B. The lighting fixtures 10 are in a space that includes a task surface TS, which may be subjected to sunlight during daylight hours through a window, skylight, or the like. In this embodiment, the ambient light sensors $S_A$ are located in a waveguide 22, which is located outside of the mixing chamber 30.

In general, the driver module 36 will monitor the ambient light levels that are sensed by the ambient light sensor $S_A$ and control the drive signals that are provided to the LED array 26, based at least in part on the detected ambient light levels. As will be described further below, the ambient light levels may be measured when the LED array 26 is on, off, or dimmed to a defined level. These one or more ambient light level measurements are used to help determine how much light should be output by the lighting fixtures 10, and thus, how the driver module 36 should drive the LED array 26.

Figure 7:
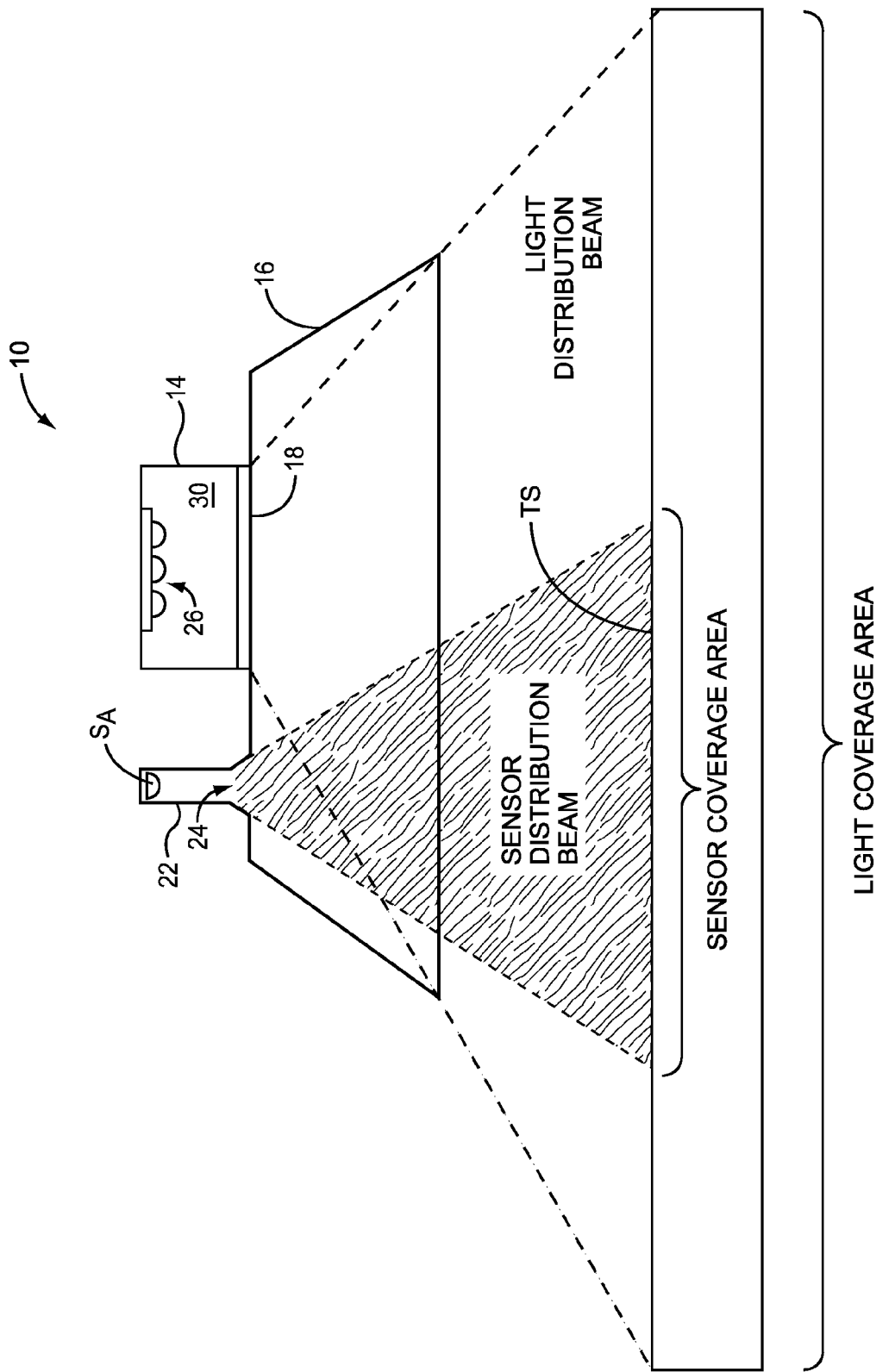
FIG. 7 illustrates an exemplary sensor distribution beam relative to an overall light distribution beam according to one embodiment of the disclosure.

As illustrated, at least lighting fixture 10A, lighting fixture 10B, and the sunlight coming in through an associated window project light onto the task surface TS. These light sources may also project light onto other room surfaces, which are not on the task surface TS or the portion of the task surface TS of interest. As such, the waveguide 22 is configured and the ambient light sensor $S_A$ is mounted within the waveguide 22 such that effectively only light reflected off of the task surface TS, or a desired portion thereof, is received by the ambient light sensor $S_A$ via the waveguide 22. In essence, the ambient light sensor $S_A$ and the waveguide 22 are configured to define a sensor distribution beam, as illustrated in FIG. 7. The sensor distribution beam, based on where the lighting fixtures 10 are mounted, defines a sensor coverage area. The sensor distribution beam may be varied based upon the depth and diameter of the waveguide 22. As illustrated, the sensor distribution beam of FIG. 7 is more narrow than the overall light distribution beam afforded by the lighting fixture 10. As such, the sensor coverage area, which is defined by the sensor distribution beam, may be less in scope than the light coverage area, which is defined by the light distribution beam. Having a narrower sensor beam distribution than the lighting fixture's light distribution beam allows the lighting fixture 10 to have more focused ambient light sensing capabilities. As such, the lighting fixtures 10 may be able to detect the ambient light levels on the task surface TS more accurately when light reflected off of non-task surface areas is not picked up by the ambient light sensor $S_A$.

Returning to FIG. 6, one goal of lighting fixture 10A may be to adjust its light output to ensure that the portion of the task surface TS that resides substantially immediately below the lighting fixture 10A has a reference light level. Accordingly, the amount of light needed to be provided by the lighting fixture 10A to ensure that the task surface TS is lit with the reference light level depends on not only the primary light provided by the lighting fixture 10A, but also on the amount of sunlight from the sun and the supplemental light provided by the adjacent lighting fixture 10B. As the amount of supplemental light and sunlight increases, the amount of primary light needed by lighting fixture 10A decreases, and vice versa.

In operation, the driver module 36 will monitor the output of the ambient light sensor $S_A$, and compare this output with a setpoint, which corresponds to a reference light level. The driver module 36 will adjust the primary light output by the LED array 26 until the output of the ambient light sensor $S_A$ matches the setpoint. At this point, the portion of the task surface TS that is covered by the ambient light sensor $S_A$ for the lighting fixture 10A is being illuminated to the reference light level by the primary light output from lighting fixture 10A, the supplemental light output from lighting fixture 10B, and the sunlight. As any of these variables change, the output of the ambient light sensor $S_A$ will change, and the driver module 36 will make adjustments to the amount of primary light output by the LED array 26 of lighting fixture 10A to ensure that the corresponding portion of the task surface TS is illuminated with the reference light level. Processes for determining the setpoint as well as measuring ambient light levels are described further below.

Figure 8:
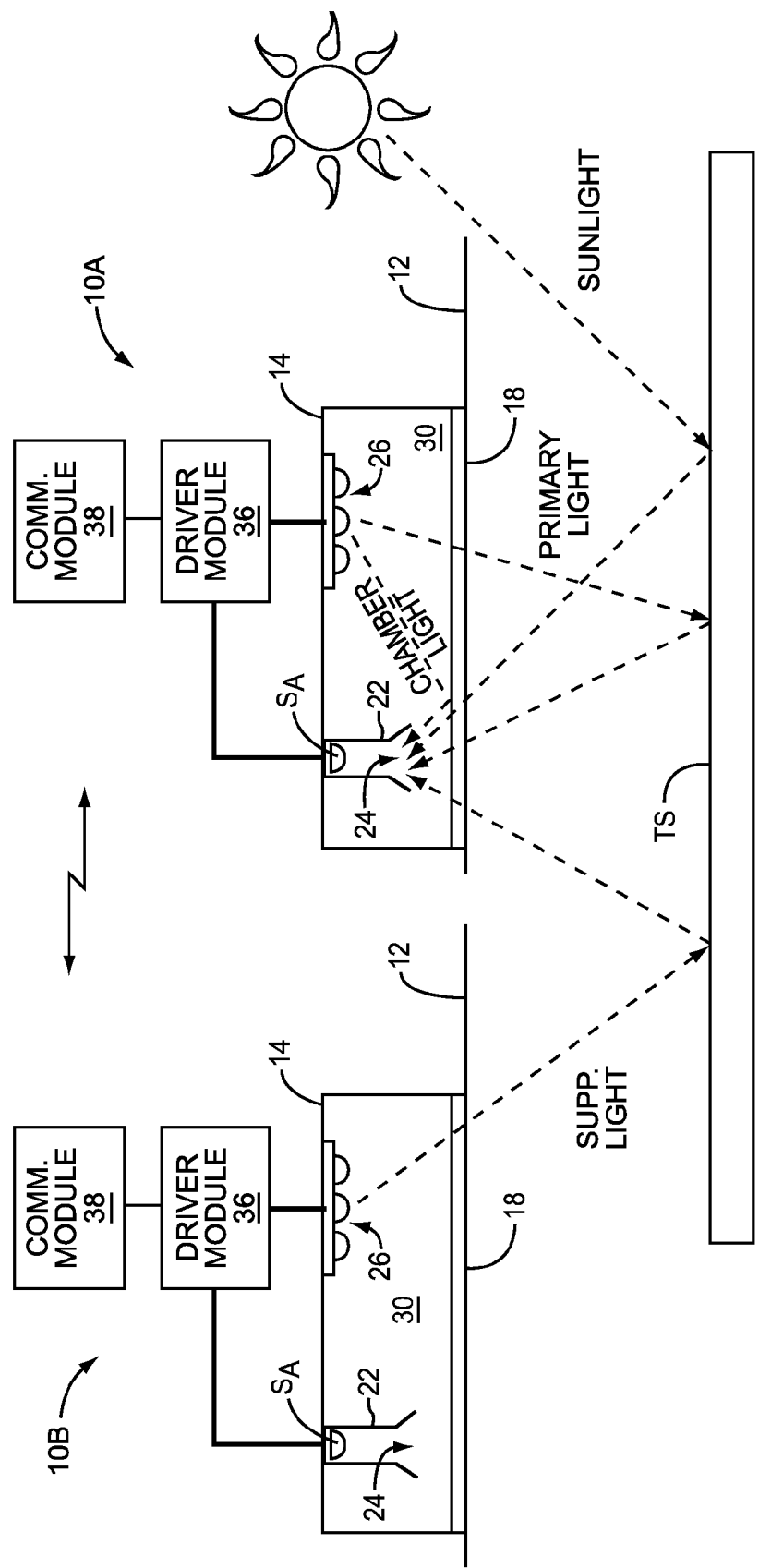
FIG. 8 illustrates a lighting environment with lighting fixtures such as those provided in FIGS. 3 and 4.

With reference to FIG. 8, an environment similar to that illustrated in FIG. 6 is provided. In FIG. 8, the ambient light sensor $S_A$ and the waveguide 22 are provided within the mixing chamber 30 of lighting fixtures 10A and 10B. As described above, the primary light output from lighting fixture 10A, the supplemental light output from lighting fixture 10B, and the sunlight may enter the waveguide 22, and thus be presented to the ambient light sensor $S_A$. Further, light within the mixing chamber 30, which is referred to as chamber light, may be directly reflected off of the lens assembly 18 and into the waveguide 22 with significant intensity. The intensity of the chamber light that is reflected into the waveguide 22 will likely saturate the ambient light sensor $S_A$, rendering it incapable of accurately detecting the light intensity of the task surface TS. As will be described further below, ambient light readings using the ambient light sensor $S_A$ of lighting fixture 10A will generally be taken when the LED array 26 of lighting fixture 10A is off.

Ambient light sensor readings from lighting fixture 10A may be shared with lighting fixture 10B, which will use this information to help drive its own LED array 26. Alternatively, the driver module 36 of lighting fixture 10A may be supplied with a look-up table or algorithm that defines a light output level for a given ambient light sensor output when the LED array 26 is off. In essence, lighting fixture 10A is calibrated to determine how much primary light it should provide based on the light level on the task surface TS when lighting fixture 10A is off.

Figure 9:
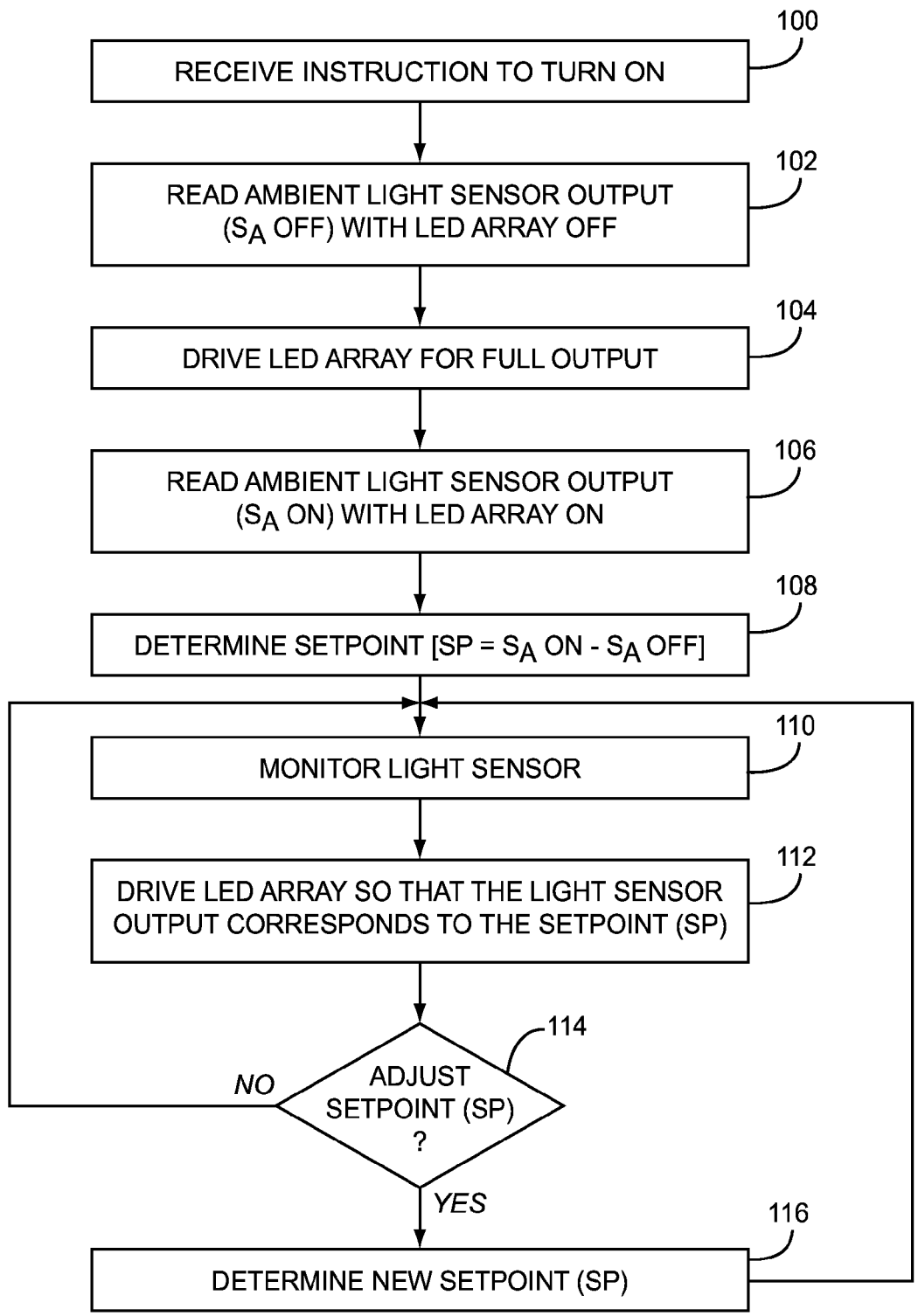
FIG. 9 is a flow diagram illustrating operation of a lighting fixture according to a first example.

With reference to FIG. 9, a flow diagram illustrates one example for determining a setpoint and operating a lighting fixture 10 that has the ambient light sensor $S_A$ located outside of the mixing chamber 30, such as that illustrated in FIGS. 1, 2, and 6. The flow diagram illustrates the processing of the driver module 36 for the lighting fixture 10. Initially, the lighting fixture 10 may receive an instruction to turn on from a lighting switch, control entity, or another lighting fixture 10 (step 100). Before providing any drive signals to the LED array 26, the driver module 36 may read the ambient light sensor output, $S_A$ OFF, with the LED array 26 off (step 102), and store this value.

The driver module 36 will store the ambient light sensor output and then drive the LED array 26 at its full output (step 104) and then read the ambient light sensor output, $S_A$ ON, with the LED array 26 on (step 106). This value is then stored. Next, the driver module 36 may determine a setpoint SP, by subtracting the ambient light sensor output $S_A$ OFF from the ambient light sensor output $S_A$ ON (SP=$S_A$ ON−$S_A$ OFF) (step 108). The setpoint SP may correspond to the output of the ambient light sensor $S_A$ when the task surface TS is appropriately lit with the reference light level. This assumes that the lighting in the space in which the task surface resides is appropriately designed. Alternatively, the setpoint SP may need to be manually set during commissioning of the lighting fixture 10 and the network in which it resides.

Once the setpoint SP is determined, the driver module 36 will monitor the light sensor output (step 110) and drive the LED array 26, such that the light sensor output corresponds to the setpoint SP (step 112). Adjustment of the LED array 26 based on the light sensor output may take place just during initial turn on, periodically during operation, continuously during operation, or at select times as desired or defined by the designer. Further, the driver module 36 may periodically adjust the setpoint SP. As such, the driver module 36 may determine whether to adjust the setpoint SP (step 114), and if the setpoint SP should be adjusted, determine a new setpoint SP (step 116). If the setpoint SP does not need to be adjusted, the process may loop back to monitoring the light sensor output (step 110) and driving the LED array 26 such that the light sensor output corresponds to the setpoint SP (step 112). Similarly, once a new setpoint SP is determined (step 116), the driver module 36 will also monitor the light sensor output (step 110) and drive the LED array 26 such that the light sensor output corresponds to the new setpoint SP (step 112).

Figure 10:
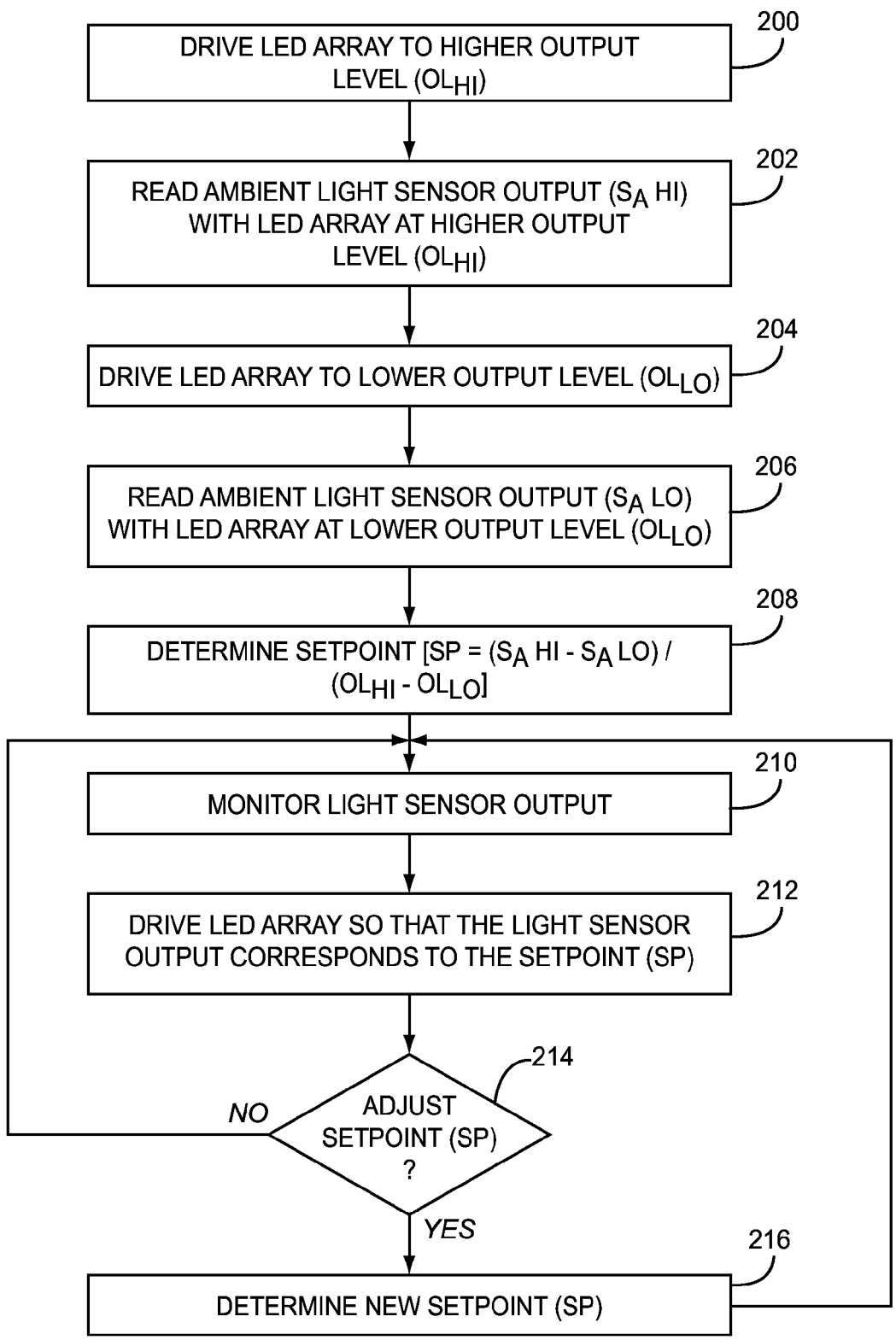
FIG. 10 is a flow diagram illustrating operation of a lighting fixture according to a second example.

In the above process, the setpoint corresponded to the difference between the ambient light sensor outputs ($S_A$ ON−$S_A$ OFF), which corresponded to the LED array 26 being fully on and fully off, respectively. However, the setpoint may be determined at any two output levels. The flow diagram of FIG. 10 illustrates such a process.

Initially, assume that the driver module 36 is driving the LED array 26 to a higher output level ($OL_{HI}$), which corresponds to a higher dimming level that is less than the full output level (step 200). At this dimmed output level, the driver module 36 will read the ambient light sensor output $S_A$ HI with the LED array 26 at the higher output level $OL_{HI}$ (step 202). This ambient light sensor output $S_A$ HI is stored, and then the driver module 36 will transition to driving the LED array 26 to a lower output level $OL_{LO}$ (step 204). The lower output level $OL_{LO}$ corresponds to a lower dimming level than the dimming level associated with the higher output level $OL_{HI}$. The driver module 36 will read the ambient light sensor output $S_A$ LO with the LED array 26 at the lower output level $OL_{LO}$ (step 206), and store this value.

Next, the driver module 36 will determine the setpoint by effectively dividing the difference in the ambient light sensor outputs ($S_A$ HI−$S_A$ LO) by the difference in the output levels ($OL_{HI}$−$OL_{LO}$), wherein:

$$SP = \frac{(S_A HI - S_A LO)}{(OL_{HI} - OL_{LO})}$$

Once the setpoint is determined and stored, the driver module 36 will monitor the light sensor output (step 210) and then drive the LED array 26 such that the light sensor output corresponds to the setpoint (step 212), as provided in the previous embodiment. Again, the driver module 36 may determine whether or not to adjust the setpoint periodically or based on an external input (step 214). If it is not time to adjust the setpoint, the driver module 36 will continue to drive the LED array 26 at the previous output level. If the setpoint needs to be adjusted, the driver module 36 will determine a new setpoint as described immediately above (step 216), and then continue to monitor the light output (step 210) and drive the LED array 26 such that the light sensor output corresponds to the new setpoint (step 212)

For either of the above embodiments, changes to the output levels, whether setting to various dimming levels or simply turning on or off the LED array 26, may take place very quickly. In fact, they may take place at a rate that is imperceptible to the human eye. For example, the setpoints may be updated based on dimmed or off output levels without occupants in the room noticing any change in the effective output levels. In essence, the light levels are modulated on and off or between dimmed output levels at an imperceptible rate, such as at a rate greater than 100 cycles per second. Again, the processes associated with the previously described flow diagrams are generally used with embodiments where the ambient light sensor $S_A$ is outside the mixing chamber 30.

Figure 11:
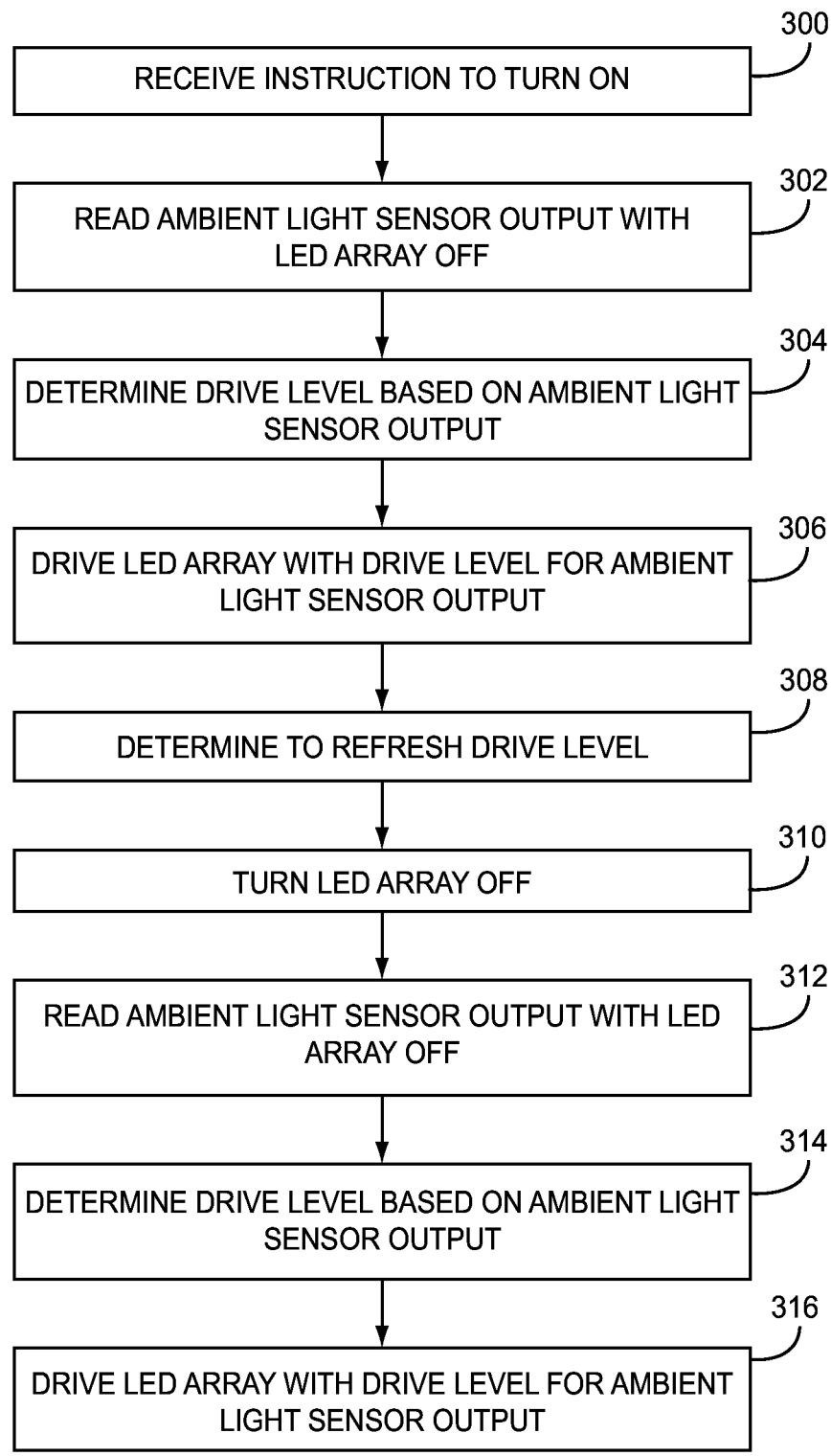
FIG. 11 is a flow diagram illustrating operation of a lighting fixture according to a third example.

With reference to FIG. 11, an exemplary process is illustrated for operating a lighting fixture 10 that is configured to have the ambient light sensor $S_A$ located within the mixing chamber 30. For this example, assume that a look-up table or other appropriate function (such as an algorithm) has been generated to associate a measured ambient light sensor output with a corresponding drive level for the LED array 26. For the look-up table or the algorithm, assume that the ambient light sensor output should be read when the LED array 26 is off. As such, the light sensor output is read when the LED array 26 is off, and the task surface TS is presumably illuminated to a level that is less than the reference light level.

Initially, the driver module 36 will receive an instruction to turn on (step 300) and then read the ambient light sensor output with the LED array 26 off (step 302). The ambient light sensor output is then used to determine a drive level (step 304) by either accessing a look-up table using the light sensor output or determining the drive level via an appropriate algorithm based on the light sensor output. Once the drive level is determined, the driver module 36 will drive the LED array 26 with the appropriate drive level for the given ambient light sensor output (step 306).

From time to time, the driver module 36 may determine that it needs to refresh the drive level (step 308). To refresh the drive level, the driver module 36 will turn the LED array 26 off (step 310) and re-read the ambient light sensor output with the LED array 26 off (step 312). Again, the driver module 36 will determine an updated drive level based on the ambient light sensor output (step 314) and then drive the LED array 26 with the drive level corresponding to the ambient light sensor output (step 316). The ambient light sensor readings may take place very quickly, wherein the driver module 36 quickly cycles the LED array 26 off and then back on when the lighting fixture 10 is normally on. As with the illustrated process, the drive level may be set every time the lighting fixture 10 is turned on.

Figure 12A:
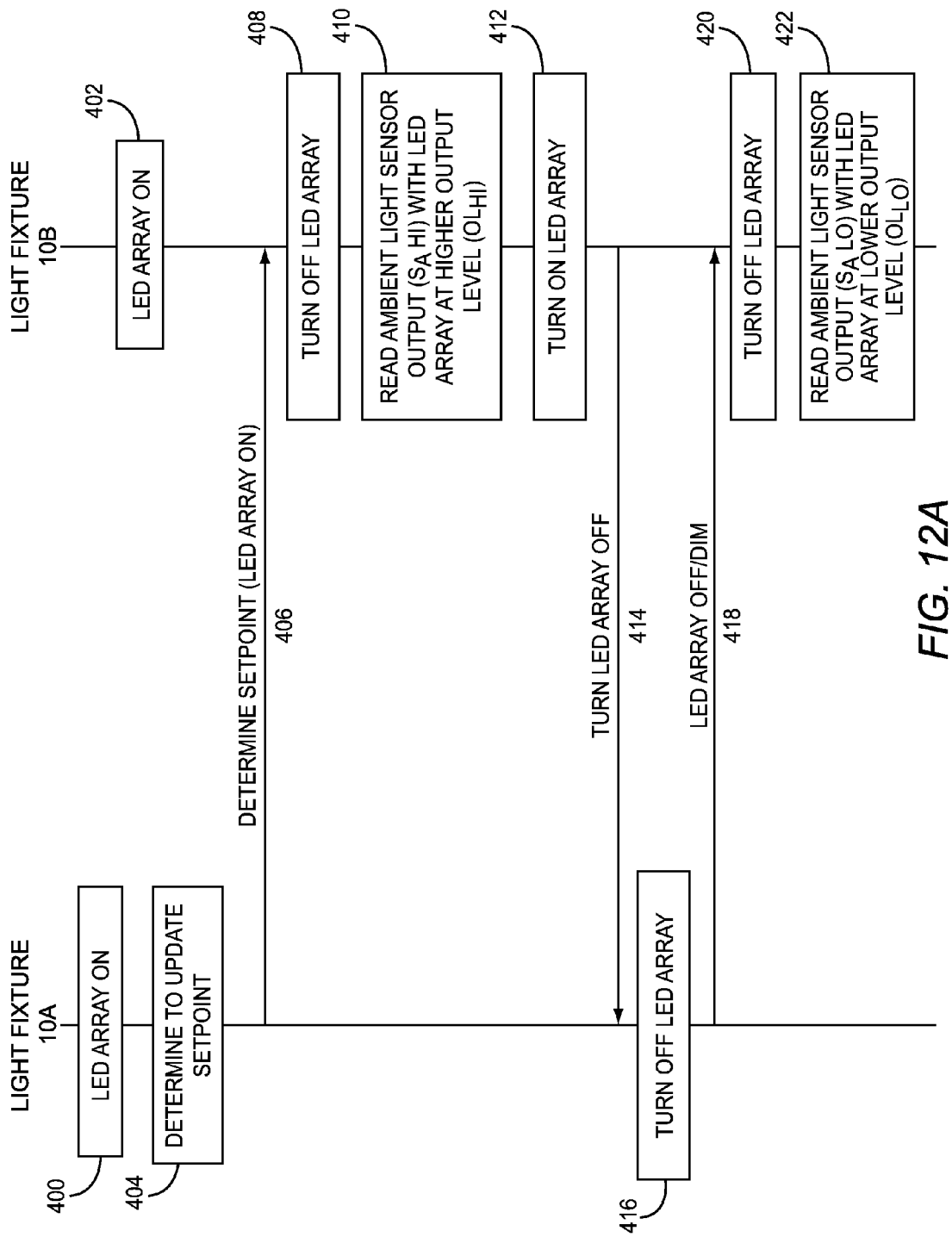
FIGS. 12A and 12B are a communication flow diagram illustrating interaction between two lighting fixtures according to a fourth example.
Figure 12B:
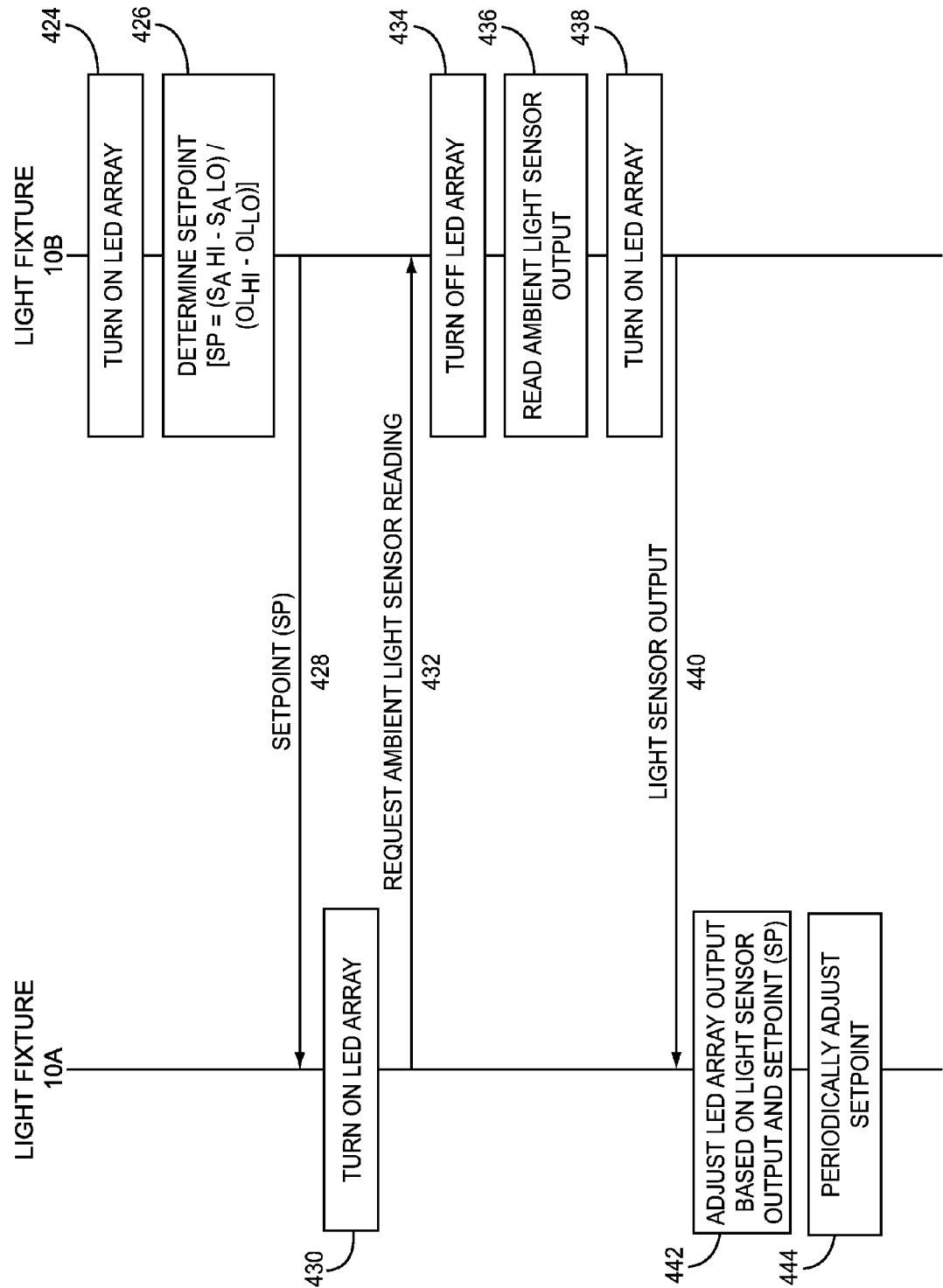

With the communications modules 38, the various lighting fixtures 10 in a lighting network may be able to communicate with each other to share data as well as control one another. For a configuration where the ambient light sensor $S_A$ is located within the mixing chamber 30, ambient light sensor outputs on a first lighting fixture 10 may be used to help determine a setpoint for another lighting fixture 10. The communication flow of FIGS. 12A and 12B illustrates an example wherein lighting fixture 10B determines a setpoint for lighting fixture 10A. Lighting fixtures 10A and 10B are configured in an arrangement similar to that illustrated in FIG. 8, wherein at least lighting fixture 10A has an ambient light sensor $S_A$ that is within the mixing chamber 30.

Initially, assume that lighting fixtures 10A and 10B are turned on and the LED arrays 26 are on (steps 400 and 402). At some point, lighting fixture 10A will determine that it needs to initially set or update its setpoint (step 404) and will subsequently send a message that will instruct lighting fixture 10B to determine a setpoint for lighting fixture 10A (step 406). This message may indicate that the LED array 26 of lighting fixture 10A is currently on. Lighting fixture 10B will receive the message from lighting fixture 10A and will proceed to turn off its LED array 26 (step 408) and read its ambient light sensor output $S_A$ HI with the LED array of lighting fixture 10A at its higher output level $OL_{HI}$ (step 410). Lighting fixture 10B will then turn its LED array 26 back on (step 412) and send an instruction to lighting fixture 10A to turn its LED array 26 off (step 414). Lighting fixture 10A will respond by turning its LED array 26 off (step 416) and providing a message back to lighting fixture 10B indicating that the LED array 26 is off (or at a lower dimming level in certain embodiments) (step 418). Lighting fixture 10B will respond by turning its LED array 26 off (step 420) and reading the ambient light sensor output $S_A$ LO with the LED array 26 of lighting fixture 10A at the lower output level $OL_{LO}$, which is off in this particular example (step 422).

Lighting fixture 10B will then turn its LED array 26 on (step 424) and then determine a setpoint as described above (step 426). If the ambient light readings taken by lighting fixture 10B corresponded to lighting fixture 10A's LED array 26 being fully on and fully off, the setpoint is determined by simply subtracting the respective ambient light sensor outputs $S_A$ HI–$S_A$ LO. If the respective ambient light sensor outputs $S_A$ HI and $S_A$ LO were at different dimming levels, the setpoint is determined by dividing the difference between the ambient light sensor outputs by the difference between the respective dimming levels [SP=($S_A$ HI–$S_A$ LO)/($OL_{HI}$–$OL_{LO}$)].

Once the setpoint is determined, lighting fixture 10B will send the setpoint to lighting fixture 10A (step 428), which will store the setpoint and turn its LED array 26 on (step 430). While lighting fixture 10A currently has a setpoint, it needs an ambient light reading in order to determine how to drive its LED array 26 to achieve the appropriate reference light level on the task surface TS. At this point, lighting fixture 10A sends a message to request an ambient light sensor reading from lighting fixture 10B (step 432). Lighting fixture 10B will respond by turning off its LED array 26 (step 434), reading the ambient light sensor output (step 436), and then turning its LED array 26 back on (step 438). Lighting fixture 10B will then send the measured light sensor output back to lighting fixture 10A (step 440), which will adjust its LED array output based on the light sensor output and the setpoint (step 442). The process of requesting ambient light sensor readings from lighting fixture 10B may be iterative, such that lighting fixture 10A can adjust its light output to the appropriate levels based on the setpoint determined by lighting fixture 10B and the ambient light sensor readings from lighting fixture 10B. Once the light output is properly set, lighting fixture 10A may periodically request updates for the ambient light sensor readings from lighting fixture 10B and adjust the output of the LED array 26 accordingly. Further, lighting fixture 10A may periodically adjust the setpoint, as described above, to compensate for changes in ambient light conditions or the reflectivity of the task surface TS (step 444). This may require enlisting the services of lighting fixture 10B or another lighting fixture 10.

While in the above embodiment lighting fixture 10B determines the setpoint for lighting fixture 10A, the following embodiment has lighting fixture 10B take the ambient light sensor output readings at different output levels and pass these readings to lighting fixture 10A. Lighting fixture 10A will then determine the setpoint based on the readings taken and provided by lighting fixture 10B. For this embodiment, again assume that the ambient light sensor $S_A$ is within the mixing chamber 30 of the respective lighting fixtures 10A and 10B.

Figure 13A:
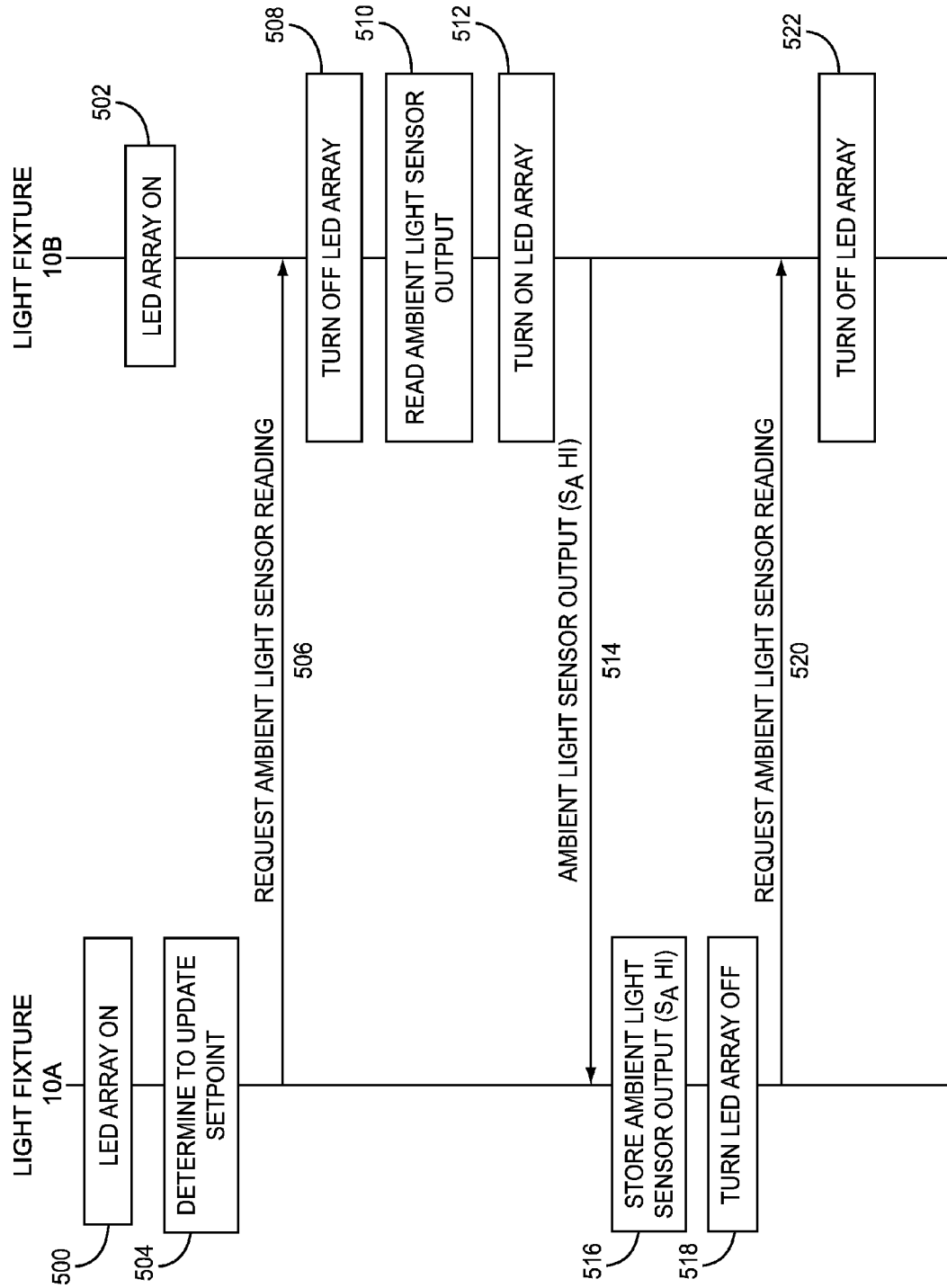
FIGS. 13A and 13B are a communication flow diagram illustrating interaction between two lighting fixtures according to a fifth example.
Figure 13B:
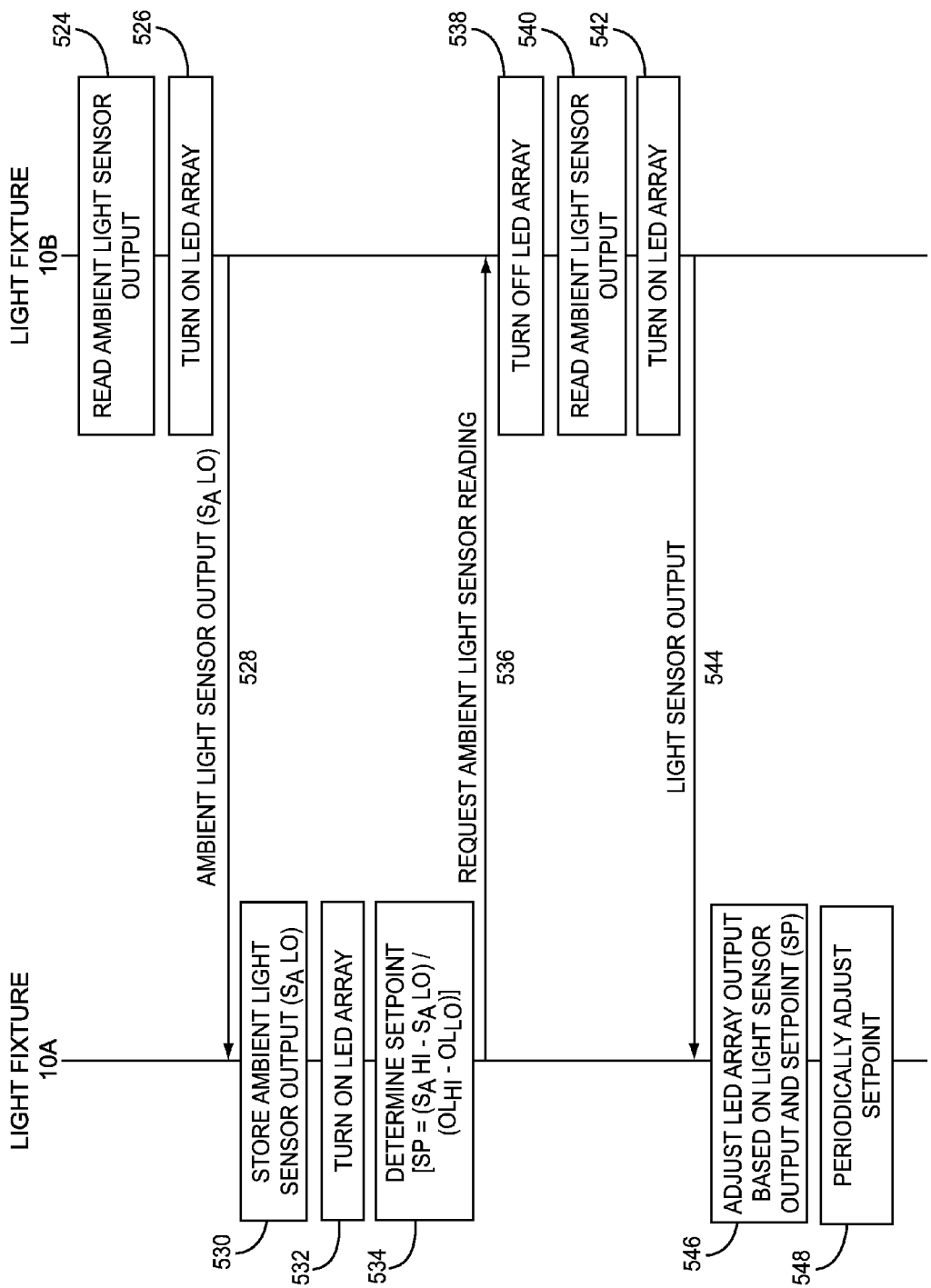

With reference to FIGS. 13A and 13B, assume that lighting fixtures 10A and 10B are currently on and the driver modules 36 are driving the respective LED arrays 26 on (steps 500 and 502). At some point, lighting fixture 10A will determine it is time to update its setpoint (step 504) and will send a request for lighting fixture 10B to provide an ambient light sensor reading (step 506). In response, lighting fixture 10B will turn off its LED array 26 (step 508), read its ambient light sensor output (step 510), and then turn its LED array 26 back on (step 512). Lighting fixture 10B will then send the ambient light sensor output back to lighting fixture 10A, which will store the ambient light sensor output (step 516) and then turn its LED array 26 off (step 518). Lighting fixture 10A will send another request for an ambient light sensor reading to lighting fixture 10B (step 520), which will turn off its LED array 26 (step 522), read the ambient light sensor output (step 524), and then turn its LED array 26 back on (step 526). Lighting fixture 10B will provide the ambient sensor output back to lighting fixture 10A (step 528), which will store the ambient light sensor output (step 530) and then turn its LED array 26 back on (step 532). Lighting fixture 10A will determine its setpoint as described above (step 534) based on the respective ambient sensor output readings, and perhaps any available dimming levels.

At this point, lighting fixture 10A sends a message to request an ambient light sensor reading from lighting fixture 10B (step 536). Lighting fixture 10B will respond by turning off its LED array 26 (step 538), reading the ambient light sensor output (step 540), and then turning its LED array 26 back on (step 542). Lighting fixture 10B will then send the measured light sensor output back to lighting fixture 10A (step 544), which will adjust its LED array output based on the light sensor output and the setpoint (step 546). The process of requesting ambient light sensor readings from lighting fixture 10B may be iterative, such that lighting fixture 10A can adjust its light output to the appropriate levels based on the setpoint determined by lighting fixture 10B and the ambient light sensor readings from lighting fixture 10B. Once the light output is properly set, lighting fixture 10A may periodically request updates for the ambient light sensor readings from lighting fixture 10B and adjust the output of the LED array 26 accordingly. Further, lighting fixture 10A may periodically adjust the setpoint, as described above, to compensate for changes in ambient light conditions or the reflectivity of the task surface TS (step 548). This may require enlisting the services of lighting fixture 10B or another lighting fixture 10.

Figure 14:
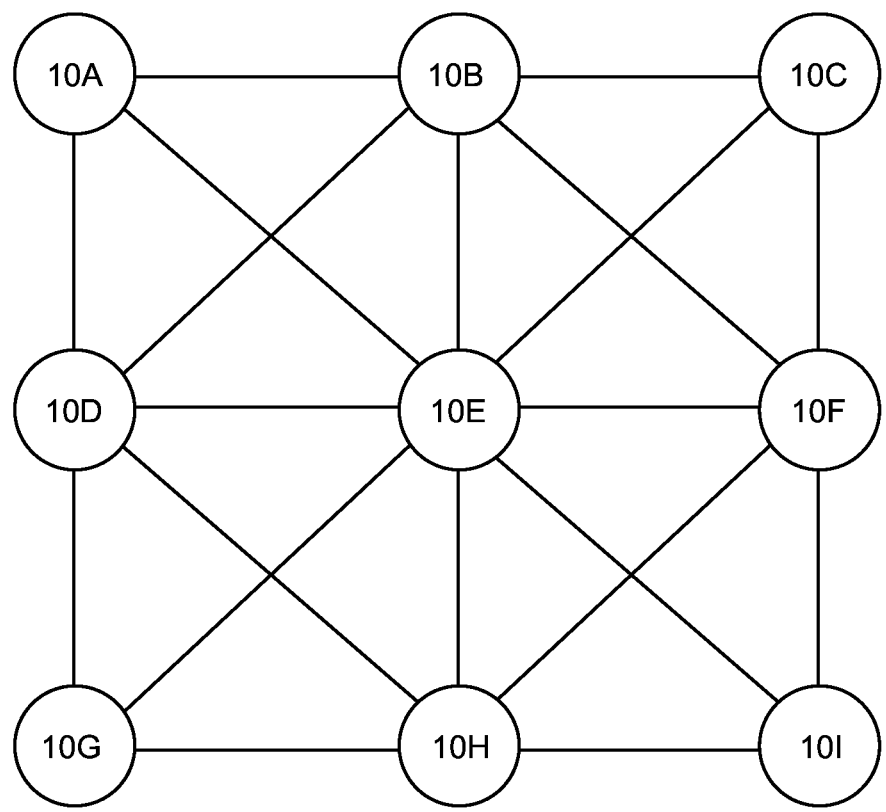
FIG. 14 is a block representation of a lighting network.

With reference to FIG. 14, a block representation of a lighting network is shown with lighting fixtures 10A through 10l. Assume the lighting fixtures 10A through 10l are networked together though wireless communications and form a mesh network. While a wireless mesh network is described, other wired or wireless networking technologies may be employed to facilitate communications between the various lighting fixtures 10A through 10l.

When the lighting fixtures 10A through 10l are configured such that the ambient light sensor $S_A$ is located outside of the mixing chamber 30, determining a setpoint and controlling how the LED arrays 26 of the lighting fixtures 10 are driven may take place as follows. In a first embodiment, each of the lighting fixtures 10 determines its own setpoint and drives its own LED array 26 based on its own ambient sensor readings and the setpoint. In essence, each lighting fixture 10 acts somewhat independently in this regard. The timing of the setpoint process may take place during a power up phase, as described above in association with FIGS. 9 and 10. The ambient light sensor readings needed for the setpoint and adjusting the drive of the LED arrays 26 may take place in concert or in a randomized fashion among the lighting fixtures 10A through 10l.

In a second embodiment, each lighting fixture 10 will determine its own preliminary setpoint and then share this setpoint with a designated coordinator, which could be another one of the lighting fixtures 10A through 10l or other device. The coordinator will process the preliminary setpoints for all of the lighting fixtures and generate a group setpoint. The group setpoint is then sent out to all of the lighting fixtures 10, which will use the common setpoint as described above to set light output levels. In more complex scenarios, the coordinator may determine different setpoints for the different lighting fixtures 10 in the lighting network, such that different lighting fixtures 10 may function to provide different reference light levels for different portions of the task surface TS or different areas in the space. Alternatively, the preliminary setpoints of the various lighting fixtures 10 may be shared with one another, and then each lighting fixture 10 can determine a primary setpoint to use during operation based on all or a subset of the preliminary setpoints.

Similarly, the ambient light sensor readings that are needed to generate setpoints may be shared amongst the group, such that each lighting fixture 10 can analyze the readings from itself and the group to determine its own setpoint. Alternatively, these readings may be provided to the coordinator, which will determine a common setpoint for the group or different setpoints for different lighting fixtures 10 of the group. Again, the measurements necessary for determining a setpoint may take place in concert as a group, in a coordinated fashion where measurements are taken one lighting fixture at a time, or in an independently randomized fashion where each lighting fixture 10 randomly adjusts its light output in an imperceptible way and measures the output of its ambient light sensor $S_A$.

During normal operation, any one of the lighting fixture 10 or the coordinator may send out adjustments to the setpoint or a new setpoint to all or a subset of the group to effectively raise or lower the reference light level that the lighting fixtures are trying to provide on the task surface TS. During operation, the lighting fixtures 10 may independently adjust their output levels to maintain the reference light level based on changes in ambient room light, color, brightness, reflectivity of the task surface TS, and the like.

The same or similar operation can be provided for embodiments wherein the ambient light sensor $S_A$ is provided inside the mixing chamber 30. However, for instances where an ambient light reading must be taken from another lighting fixture 10, the ambient lighting readings or setpoint determinations may be shared with numerous lighting fixtures 10 or the coordinator for independent or group control. Any time the group needs to synchronize taking a reading or turning on or off, they can be synchronized based on time, monitoring AC line zero crossings, or a triggering message provided by one of the lighting fixtures 10. When random measurements are taken, the multiple measurements may be taken and then averaged together to effectively filter out a measurement, for example, when multiple lighting fixtures happen to be off or on and only one lighting fixture should be off or on.

Figure 15:
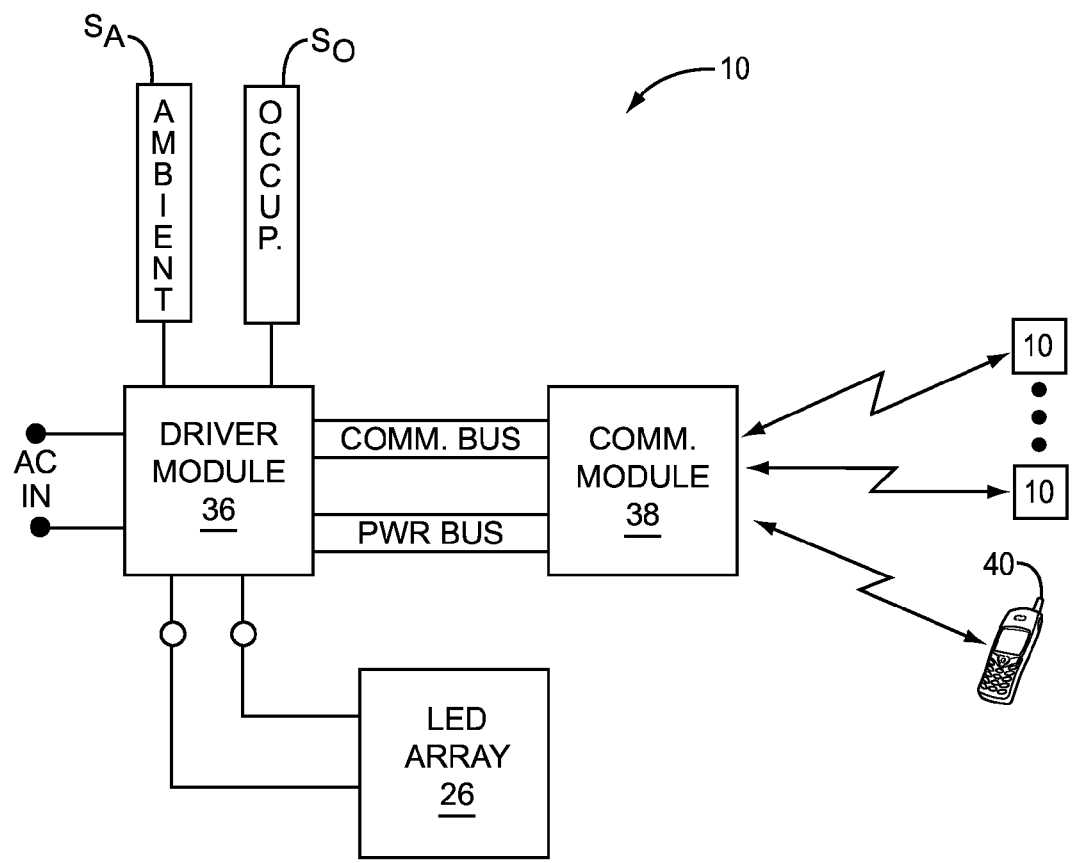
FIG. 15 is a block diagram of a lighting system according to one embodiment of the disclosure.

Turning now to FIG. 15, a block diagram of a lighting fixture 10 is provided according to one embodiment. Assume for purposes of discussion that the driver module 36, communications module 38, and LED array 26 are ultimately connected to form the core electronics of the lighting fixture 10, and that the communications module 38 is configured to bidirectionally communicate with other lighting fixtures 10, the commissioning tool 40, or any other entity through wired or wireless techniques. In this embodiment, a defined communication interface and protocol are used to facilitate communications between the driver module 36 and the communications module 38.

In the illustrated embodiment, the driver module 36 and the communications module 38 are coupled via a communication bus (COMM BUS) and a power bus (PWR BUS). The communication bus allows the driver module 36 to exchange data or commands with the communications module 38. An exemplary communication bus is the well-known inter-integrated circuitry ($I^2C$) bus, which is a serial bus and is typically implemented with a two-wire interface employing data and clock lines. Other available buses include: serial peripheral interface (SPI) bus, Dallas Semiconductor Corporation's 1-Wire serial bus, universal serial bus (USB), RS-232, Microchip Technology Incorporated's UNI/O®, and the like.

The driver module 36 may be coupled to an AC (alternating current) power source via the AC IN port. The AC power may be controlled via a remote switch, wherein when an AC signal is applied, the driver module 36 will power on and provide appropriate drive currents to the LEDs of the LED array 26. The AC power signal may be provided to include a desired dimming level, which is monitored by the driver module 36 and used to control the drive currents to provide a light output intensity corresponding to the dimming level. Alternatively, a separate dimming signal (not shown) from the AC power signal may be provided to the driver module 36, wherein the driver module 36 will control the drive currents based on the dimming signal.

In this embodiment, the driver module 36 is optionally configured to collect data from the ambient light sensor $S_A$ and perhaps an occupancy sensor $S_O$ or other sensor. The driver module 36 may use the data collected from the ambient light sensor $S_A$ and the occupancy sensor $S_O$ to control how the LEDs of the LED array 26 are driven. The data collected from the ambient light sensor $S_A$ and the occupancy sensor $S_O$ as well as any other operational parameters of the driver module 36 may also be shared with the communications module 38 or other remote entities via the communications module 38.

Figure 16:
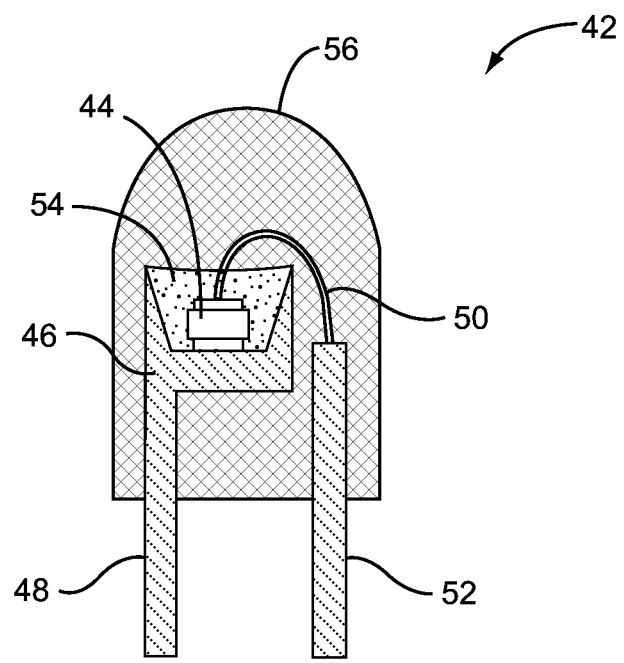
FIG. 16 is a cross-section of an exemplary LED according to a first embodiment of the disclosure.

A description of an exemplary embodiment of the LED array 26, driver module 36, and the communications module 38 follows. As noted, the LED array 26 includes a plurality of LEDs, such as the LEDs 42 illustrated in FIGS. 16 and 17. With reference to FIG. 16, a single LED chip 44 is mounted on a reflective cup 46 using solder or a conductive epoxy, such that ohmic contacts for the cathode (or anode) of the LED chip 44 are electrically coupled to the bottom of the reflective cup 46. The reflective cup 46 is either coupled to or integrally formed with a first lead 48 of the LED 42. One or more bond wires 50 connect ohmic contacts for the anode (or cathode) of the LED chip 44 to a second lead 52.

The reflective cup 46 may be filled with an encapsulant material 54 that encapsulates the LED chip 44. The encapsulant material 54 may be clear or may contain a wavelength conversion material, such as a phosphor, which is described in greater detail below. The entire assembly is encapsulated in a clear protective resin 56, which may be molded in the shape of a lens to control the light emitted from the LED chip 44.

Figure 17:
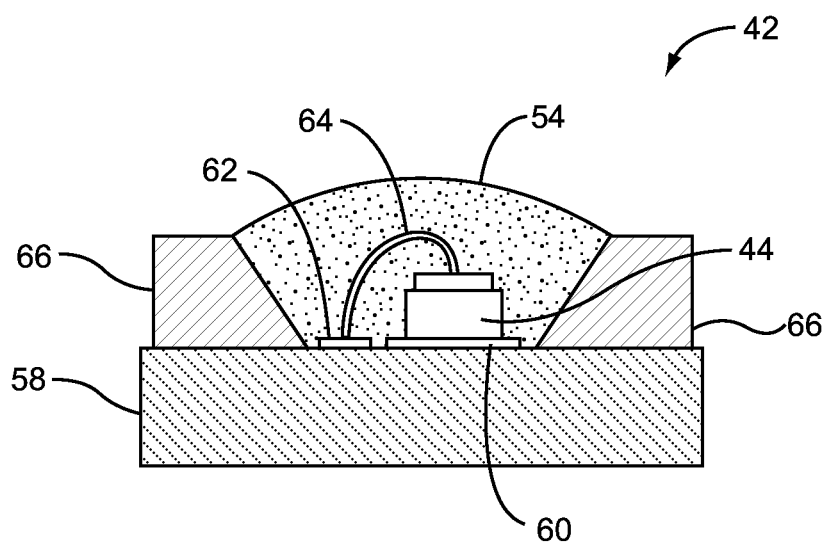
FIG. 17 is a cross-section of an exemplary LED according to a second embodiment of the disclosure.

An alternative package for an LED 42 is illustrated in FIG. 17 wherein the LED chip 44 is mounted on a substrate 58. In particular, the ohmic contacts for the anode (or cathode) of the LED chip 44 are directly mounted to first contact pads 60 on the surface of the substrate 58. The ohmic contacts for the cathode (or anode) of the LED chip 44 are connected to second contact pads 62, which are also on the surface of the substrate 58, using bond wires 64. The LED chip 44 resides in a cavity of a reflector structure 66, which is formed from a reflective material and functions to reflect light emitted from the LED chip 44 through the opening formed by the reflector structure 66. The cavity formed by the reflector structure 66 may be filled with an encapsulant material 54 that encapsulates the LED chip 44. The encapsulant material 54 may be clear or may contain a wavelength conversion material, such as a phosphor.

In either of the embodiments of FIGS. 16 and 17, if the encapsulant material 54 is clear, the light emitted by the LED chip 44 passes through the encapsulant material 54 and the protective resin 56 without any substantial shift in color. As such, the light emitted from the LED chip 44 is effectively the light emitted from the LED 42. If the encapsulant material 54 contains a wavelength conversion material, substantially all or a portion of the light emitted by the LED chip 44 in a first wavelength range may be absorbed by the wavelength conversion material, which will responsively emit light in a second wavelength range. The concentration and type of wavelength conversion material will dictate how much of the light emitted by the LED chip 44 is absorbed by the wavelength conversion material as well as the extent of the wavelength conversion. In embodiments where some of the light emitted by the LED chip 44 passes through the wavelength conversion material without being absorbed, the light passing through the wavelength conversion material will mix with the light emitted by the wavelength conversion material. Thus, when a wavelength conversion material is used, the light emitted from the LED 42 is shifted in color from the actual light emitted from the LED chip 44.

For example, the LED array 26 may include a group of BSY or BSG LEDs 42 as well as a group of red LEDs 42. BSY LEDs 42 include an LED chip 44 that emits bluish light, and the wavelength conversion material is a yellow phosphor that absorbs the blue light and emits yellowish light. Even if some of the bluish light passes through the phosphor, the resultant mix of light emitted from the overall BSY LED 42 is yellowish light. The yellowish light emitted from a BSY LED 42 has a color point that falls above the Black Body Locus (BBL) on the 1931 CIE chromaticity diagram wherein the BBL corresponds to the various color temperatures of white light.

Similarly, BSG LEDs 42 include an LED chip 44 that emits bluish light; however, the wavelength conversion material is a greenish phosphor that absorbs the blue light and emits greenish light. Even if some of the bluish light passes through the phosphor, the resultant mix of light emitted from the overall BSG LED 42 is greenish light. The greenish light emitted from a BSG LED 42 has a color point that falls above the BBL on the 1931 CIE chromaticity diagram wherein the BBL corresponds to the various color temperatures of white light.

The red LEDs 42 generally emit reddish light at a color point on the opposite side of the BBL as the yellowish or greenish light of the BSY or BSG LEDs 42. As such, the reddish light from the red LEDs 42 mixes with the yellowish or greenish light emitted from the BSY or BSG LEDs 42 to generate white light that has a desired color temperature and falls within a desired proximity of the BBL. In effect, the reddish light from the red LEDs 42 pulls the yellowish or greenish light from the BSY or BSG LEDs 42 to a desired color point on or near the BBL. Notably, the red LEDs 42 may have LED chips 44 that natively emit reddish light wherein no wavelength conversion material is employed. Alternatively, the LED chips 44 may be associated with a wavelength conversion material, wherein the resultant light emitted from the wavelength conversion material and any light that is emitted from the LED chips 44 without being absorbed by the wavelength conversion material mixes to form the desired reddish light.

The blue LED chip 44 used to form either the BSY or BSG LEDs 42 may be formed from a gallium nitride (GaN), indium gallium nitride (InGaN), silicon carbide (SiC), zinc selenide (ZnSe), or like material system. The red LED chip 44 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08540, and the like. The above LED architectures, phosphors, and material systems are merely exemplary and are not intended to provide an exhaustive listing of architectures, phosphors, and materials systems that are applicable to the concepts disclosed herein.

Figure 18:
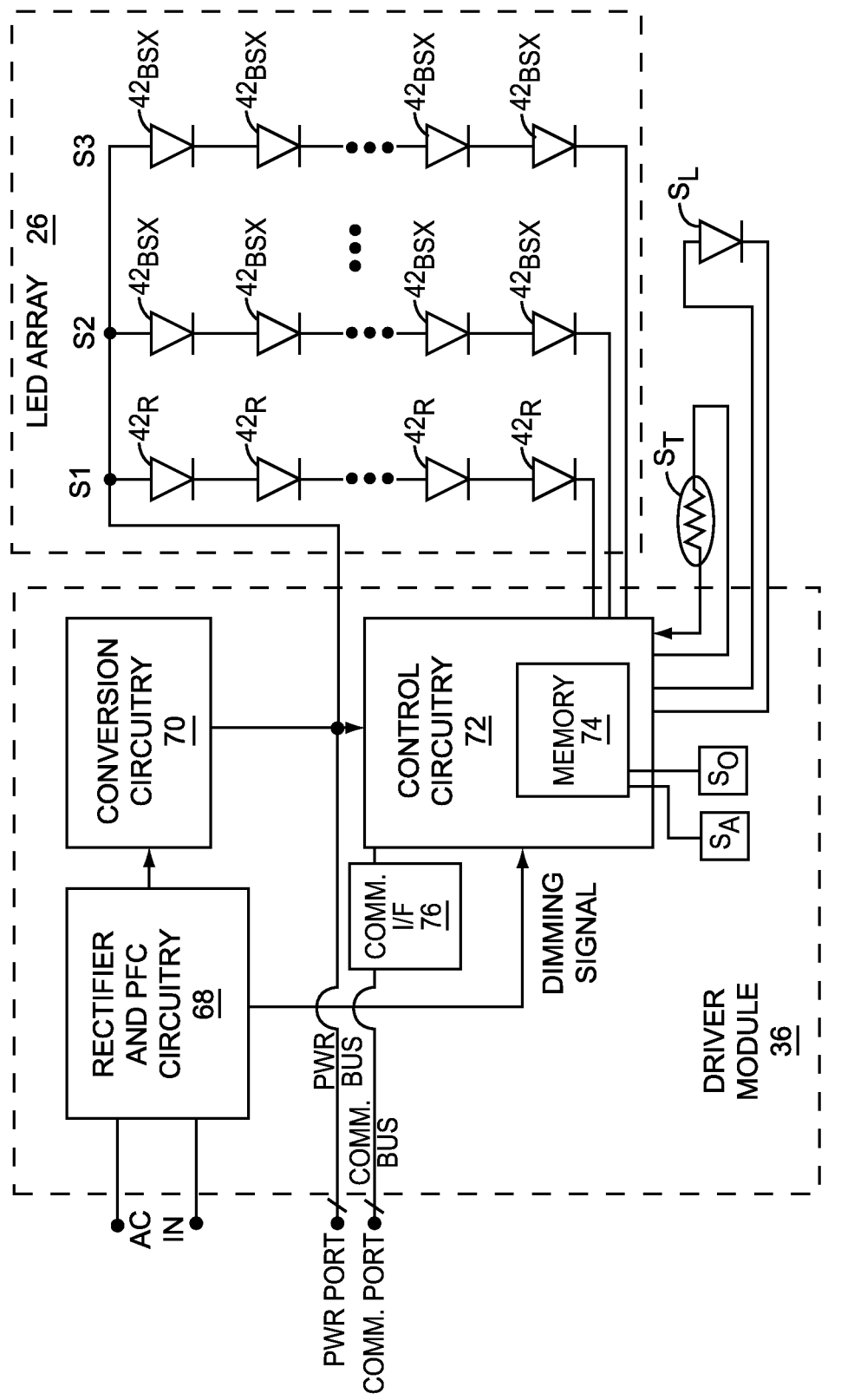
FIG. 18 is a schematic of a driver module and an LED array according to one embodiment of the disclosure.

As noted, the LED array 26 may include a mixture of red LEDs 42 and either BSY or BSG LEDs 42. The driver module 36 for driving the LED array 26 is illustrated in FIG. 18 according to one embodiment of the disclosure. The LED array 26 may be electrically divided into two or more strings of series connected LEDs 42. As depicted, there are three LED strings S1, S2, and S3. For clarity, the reference number "42" will include a subscript indicative of the color of the LED 42 in the following text where 'R' corresponds to red, 'BSY' corresponds to blue shifted yellow, 'BSG' corresponds to blue shifted green, and 'BSX' corresponds to either BSG or BSY LEDs. LED string S1 includes a number of red LEDs $42_R$, LED string S2 includes a number of either BSY or BSG LEDs $42_{BSX}$, and LED string S3 includes a number of either BSY or BSG LEDs $42_{BSX}$. The driver module 36 controls the current delivered to the respective LED strings S1, S2, and S3. The current used to drive the LEDs 42 is generally pulse width modulated (PWM), wherein the duty cycle of the pulsed current controls the intensity of the light emitted from the LEDs 42.

The BSY or BSG LEDs $42_{BSX}$ in the second LED string S2 may be selected to have a slightly more bluish hue (less yellowish or greenish hue) than the BSY or BSG LEDs $42_{BSX}$ in the third LED string S3. As such, the current flowing through the second and third strings S2 and S3 may be tuned to control the yellowish or greenish light that is effectively emitted by the BSY or BSG LEDs $42_{BSX}$ of the second and third LED strings S2, S3. By controlling the relative intensities of the yellowish or greenish light emitted from the differently hued BSY or BSG LEDs $42_{BSX}$ of the second and third LED strings S2, S3, the hue of the combined yellowish or greenish light from the second and third LED strings S2, S3 may be controlled in a desired fashion.

The ratio of current provided through the red LEDs $42_R$ of the first LED string S1 relative to the currents provided through the BSY or BSG LEDs $42_{BSX}$ of the second and third LED strings S2 and S3 may be adjusted to effectively control the relative intensities of the reddish light emitted from the red LEDs $42_R$ and the combined yellowish or greenish light emitted from the various BSY or BSG LEDs $42_{BSX}$. As such, the intensity and the color point of the yellowish or greenish light from BSY or BSG LEDs $42_{BSX}$ can be set relative to the intensity of the reddish light emitted from the red LEDs $42_R$. The resultant yellowish or greenish light mixes with the reddish light to generate white light that has a desired color temperature and falls within a desired proximity of the BBL.

Notably, the number of LED strings Sx may vary from one to many and different combinations of LED colors may be used in the different strings. The LED array 26 may have one or more strings Sx. Each LED string Sx may have LEDs 42 of the same color, variations of the same color, or substantially different colors, such as red, green, and blue. In one embodiment, a single LED string may be used for each LED array 26, wherein the LEDs in the string are all substantially identical in color, vary in substantially the same color, or include different colors. In another embodiment, three LED strings Sx with red, green, and blue LEDs may be used for each LED array 26, wherein each LED string Sx is dedicated to a single color. In yet another embodiment, at least two LED strings Sx may be used, wherein different colored BSY LEDs are used in one of the LED strings Sx and red LEDs are used in the other of the LED strings Sx.

The driver module 36 depicted in FIG. 18 generally includes rectifier and power factor correction (PFC) circuitry 68, conversion circuitry 70, and control circuitry 72. The rectifier and power factor correction circuitry 68 is adapted to receive an AC power signal (AC IN), rectify the AC power signal, and correct the power factor of the AC power signal. The resultant signal is provided to the conversion circuitry 70, which converts the rectified AC power signal to a DC power signal. The DC power signal may be boosted or bucked to one or more desired DC voltages by DC-DC converter circuitry, which is provided by the conversion circuitry 70. Internally, The DC power signal may be used to power the control circuitry 72 and any other circuitry provided in the driver module 36.

The DC power signal is also provided to the power bus, which is coupled to one or more power ports, which may be part of the standard communication interface. The DC power signal provided to the power bus may be used to provide power to one or more external devices that are coupled to the power bus and separate from the driver module 36. These external devices may include the communications module 38 and any number of auxiliary devices, which are discussed further below. Accordingly, these external devices may rely on the driver module 36 for power and can be efficiently and cost effectively designed accordingly. The rectifier and PFC circuitry 68 and the conversion circuitry 70 of the driver module 36 are robustly designed in anticipation of being required to supply power to not only its internal circuitry and the LED array 26, but also to supply power to these external devices as well. Such a design greatly simplifies the power supply design, if not eliminating the need for a power supply, and reduces the cost for these external devices.

As illustrated, the DC power signal may be provided to another port, which will be connected by cabling to the LED array 26. In this embodiment, the supply line of the DC power signal is ultimately coupled to the first end of each of the LED strings S1, S2, and S3 in the LED array 26. The control circuitry 72 is coupled to the second end of each of the LED strings S1, S2, and S3 by the cabling. Based on any number of fixed or dynamic parameters, the control circuitry 72 may individually control the pulse width modulated current that flows through the respective LED strings S1, S2, and S3 such that the resultant white light emitted from the LED strings S1, S2, and S3 has a desired color temperature and falls within a desired proximity of the BBL. Certain of the many variables that may impact the current provided to each of the LED strings S1, S2, and S3 include: the magnitude of the AC power signal, the resultant white light, ambient temperature of the driver module 36 or LED array 26. Notably, the architecture used to drive the LED array 26 in this embodiment is merely exemplary, as those skilled in the art will recognize other architectures for controlling the drive voltages and currents presented to the LED strings S1, S2, and S3.

In certain instances, a dimming device controls the AC power signal. The rectifier and PFC circuitry 68 may be configured to detect the relative amount of dimming associated with the AC power signal and provide a corresponding dimming signal to the control circuitry 72. Based on the dimming signal, the control circuitry 72 will adjust the current provided to each of the LED strings S1, S2, and S3 to effectively reduce the intensity of the resultant white light emitted from the LED strings S1, S2, and S3 while maintaining the desired color temperature. Dimming instructions may alternatively be delivered from the communications module 38 to the control circuitry 72 in the form of a command via the communication bus.

The intensity or color of the light emitted from the LEDs 42 may be affected by ambient temperature. If associated with a thermistor $S_T$ or other temperature-sensing device, the control circuitry 72 can control the current provided to each of the LED strings S1, S2, and S3 based on ambient temperature in an effort to compensate for adverse temperature effects. The intensity or color of the light emitted from the LEDs 42 may also change over time. If associated with an LED light sensor $S_L$, the control circuitry 72 can measure the color of the resultant white light being generated by the LED strings S1, S2, and S3 and adjust the current provided to each of the LED strings S1, S2, and S3 to ensure that the resultant white light maintains a desired color temperature or other desired metric. The control circuitry 72 may also monitor the output of the occupancy and ambient light sensors $S_O$ and $S_A$ for occupancy and ambient light information.

The control circuitry 72 may include a central processing unit (CPU) and sufficient memory 74 to enable the control circuitry 72 to bidirectionally communicate with the communications module 38 or other devices over the communication bus through an appropriate communication interface (I/F) 76 using a defined protocol, such as the standard protocol described above. The control circuitry 72 may receive instructions from the communications module 38 or other device and take appropriate action to implement the received instructions. The instructions may range from controlling how the LEDs 42 of the LED array 26 are driven to returning operational data, such as temperature, occupancy, light output, or ambient light information, that was collected by the control circuitry 72 to the communications module 38 or other device via the communication bus. The functionality of the communications module 38 may be integrated into the driver module 36, and vice versa.

Figure 19:
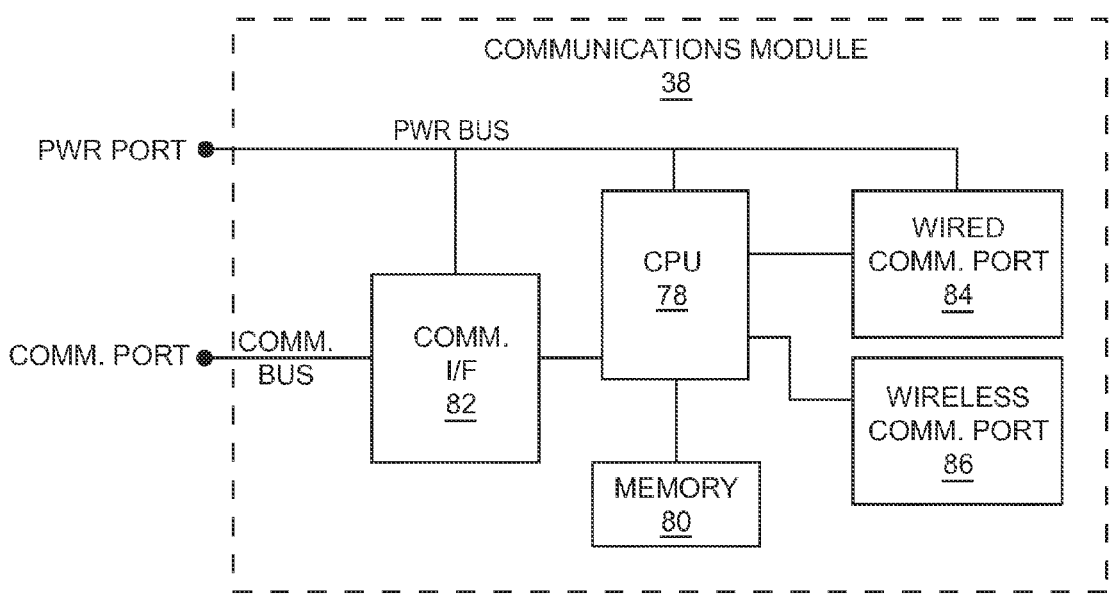
FIG. 19 is a block diagram of a communications module according to one embodiment of the disclosure.

With reference to FIG. 19, a block diagram of one embodiment of the communications module 38 is illustrated. The communications module 38 includes a CPU 78 and associated memory 80 that contains the requisite software instructions and data to facilitate operation as described herein. The CPU 78 may be associated with a communication interface 82, which is to be coupled to the driver module 36, directly or indirectly via the communication bus. The CPU 78 may also be associated with a wired communication port 84, a wireless communication port 86, or both, to facilitate wired or wireless communications with other lighting fixtures 10 and remote control entities.

The capabilities of the communications module 38 may vary greatly from one embodiment to another. For example, the communications module 38 may act as a simple bridge between the driver module 36 and the other lighting fixtures 10 or remote control entities. In such an embodiment, the CPU 78 will primarily pass data and instructions received from the other lighting fixtures 10 or remote control entities to the driver module 36, and vice versa. The CPU 78 may translate the instructions as necessary based on the protocols being used to facilitate communications between the driver module 36 and the communications module 38 as well as between the communications module 38 and the remote control entities. In other embodiments, the CPU 78 plays an important role in coordinating intelligence and sharing data among the lighting fixtures 10.

Power for the CPU 78, memory 80, the communication interface 82, and the wired and/or wireless communication ports 84 and 86 may be provided over the power bus via the power port. As noted above, the power bus may receive its power from the driver module 36, which generates the DC power signal. As such, the communications module 38 may not need to be connected to AC power or include rectifier and conversion circuitry. The power port and the communication port may be separate or may be integrated with the standard communication interface. The power port and communication port are shown separately for clarity. The communication bus may take many forms. In one embodiment, the communication bus is a 2-wire serial bus, wherein the connector or cabling configuration may be configured such that the communication bus and the power bus are provided using four wires: data, clock, power, and ground.

Those skilled in the art will recognize improvements and modifications to the embodiments of the present disclosure. All such improvements and modifications are considered within the scope of the concepts disclosed herein and the claims that follow.

What is claimed is:

1. A lighting fixture comprising:
a frame;
a lens assembly;
a light source housing mounted on the frame, the light source housing having an opening covered by the lens assembly and providing a mixing chamber;
a solid-state light source mounted within the mixing chamber;
an ambient light sensor mounted outside of the mixing chamber and coupled to the frame;
a waveguide mounted outside of the mixing chamber where the ambient light sensor is recessed in the waveguide,
wherein a sensor distribution beam that defines a sensor coverage area on a task surface is provided by the ambient light sensor via the waveguide and is directed in a first direction and a light distribution beam that defines a light coverage area on the task surface is provided by the solid-state light source via the lens assembly and is directed in the first direction such that the sensor coverage area is completely within the light coverage area; and
a driver module coupled to the ambient light sensor and the solid-state light source, the driver module adapted to:
drive the solid-state light source;
read a first output from the ambient light sensor with the solid-state light source driven at a first output level;
read a second output from the ambient light sensor with the solid-state light source driven at a second output level;
determine a setpoint based on a difference between the first output and the second output relative to a difference between the first output level and the second output level;
periodically adjust the setpoint to effectively raise or lower a light level of the lighting fixture; and
receive an output of the ambient light sensor and drive the solid-state light source such that the output of the ambient light sensor corresponds to the setpoint.

2. The lighting fixture of claim 1 wherein the light distribution beam is broader than the sensor distribution beam.

3. The lighting fixture of claim 1 wherein the first output level corresponds to the solid-state light source being driven to a fully on state.

4. The lighting fixture of claim 3 wherein the second output level corresponds to the solid-state light source being off.

5. The lighting fixture of claim 1 wherein the first output level corresponds to the solid-state light source being off.

6. The lighting fixture of claim 1 wherein the first output level corresponds to the solid-state light source being driven to a fully on state and the second output level corresponds to the solid-state light source being off.

7. The lighting fixture of claim 1 wherein the first output level corresponds to the solid-state light source being driven at a first dimming level and the second output level corresponds to the solid-state light source being driven at a second dimming level, which is different from the first dimming level.

8. The lighting fixture of claim 1 wherein as the driver module monitors the output of the ambient light sensor, the driver module continues to drive the solid-state light source, such that the lighting fixture is outputting light as the ambient light sensor is being monitored.

9. The lighting fixture of claim 1 wherein the driver module is further adapted to drive the solid-state light source such that the output of the ambient light sensor corresponds to the setpoint, which corresponds to a reference light level being reflected off of the task surface, the task surface being partially illuminated by the lighting fixture.

10. The lighting fixture of claim 1 wherein the driver module is further adapted to read the output of the ambient light sensor and effect delivery of the output to at least one other lighting fixture.

11. The lighting fixture of claim 1 wherein the solid-state light source comprises a plurality of LEDs.

12. The lighting fixture of claim 11 wherein the plurality of LEDs comprises at least one LED that emits light at a first color and at least one other LED that emits light at a second color that is different than the first color.

13. The lighting fixture of claim 1 wherein the first output level corresponds to a first dimming level and the second output level corresponds to a second dimming level.

14. A lighting fixture comprising:
a frame;
a lens assembly;
a light source housing mounted on the frame and having an opening covered by the lens assembly;
a solid-state light source mounted to the light source housing;
an ambient light sensor mounted outside of the light source housing, wherein a sensor distribution beam that defines a sensor coverage area on a task surface is provided by the ambient light sensor via a waveguide and is directed in a first direction and a light distribution beam that defines a light coverage area on the task surface is provided by the solid-state light source via the lens assembly and is directed in the first direction such that the sensor coverage area is completely within the light coverage area; and
a driver module coupled to the ambient light sensor and the solid-state light source, the driver module adapted to:
drive the solid-state light source;
read a first output from the ambient light sensor with the solid-state light source driven at a first output level;
read a second output from the ambient light sensor with the solid-state light source driven at a second output level;
determine a setpoint based on a difference between the first output and the second output relative to a difference between the first output level and the second output level;
periodically adjust the setpoint to effectively raise or lower a reference light level of the lighting fixture; and
receive an output of the ambient light sensor and drive the solid-state light source such that the output of the ambient light sensor corresponds to the setpoint.

15. The lighting fixture of claim 14 wherein the light distribution beam is broader than the sensor distribution beam.

16. The lighting fixture of claim 14 wherein the first output level corresponds to a first dimming level and the second output level corresponds to a second dimming level.

* * * * *

UNITED STATES PATENT AND TRADEMARK OFFICE
CERTIFICATE OF CORRECTION

PATENT NO. : 10,161,612 B2
APPLICATION NO. : 13/838398
DATED : December 25, 2018
INVENTOR(S) : Joseph P. Chobot and Daniel J. Pope Page 1 of 1

It is certified that error appears in the above-identified patent and that said Letters Patent is hereby corrected as shown below:

In the Specification

In Column 13, Lines 23, 28, 29, 43, and 47, replace "101" with --10I--.

In the Claims

In Column 20, Lines 24-26, in Claim 1, delete the following text: "a waveguide mounted outside of the mixing chamber where the ambient light sensor is recessed in the waveguide,".

In Column 20, Line 29, in Claim 1, replace "via the waveguide" with --via a waveguide--.

Signed and Sealed this
Twenty-sixth Day of February, 2019

Andrei Iancu
*Director of the United States Patent and Trademark Office*